United States Patent
Kim et al.

(10) Patent No.: US 10,811,541 B2
(45) Date of Patent: Oct. 20, 2020

(54) SEMICONDUCTOR DEVICE HAVING GERMANIUM CONTAINING ACTIVE PATTERN AND METHOD FOR FABRICATING THE SAME

(71) Applicant: SAMSUNG ELECTRONICS CO., LTD., Suwon-si, Gyeonggi-do (KR)

(72) Inventors: Jin Bum Kim, Seoul (KR); Hyoung Sub Kim, Seoul (KR); Seong Heum Choi, Suwon-si (KR); Jin Yong Kim, Seoul (KR); Tae Jin Park, Yongin-si (KR); Seung Hun Lee, Hwaseong-si (KR)

(73) Assignees: Samsung Electronics Co., Ltd., Suwon-si, Gyeonggi-do (KR); Research & Business Foundation Sungkyunkwan University, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/254,842

(22) Filed: Jan. 23, 2019

(65) Prior Publication Data
US 2019/0267494 A1    Aug. 29, 2019

(30) Foreign Application Priority Data
Feb. 23, 2018   (KR) .......................... 10-2018-0021804

(51) Int. Cl.
*H01L 29/786*   (2006.01)
*H01L 29/06*    (2006.01)
(Continued)

(52) U.S. Cl.
CPC .. *H01L 29/78696* (2013.01); *H01L 21/02236* (2013.01); *H01L 21/02255* (2013.01);
(Continued)

(58) Field of Classification Search
CPC ......... H01L 29/78696; H01L 21/02236; H01L 21/02255; H01L 21/02532;
(Continued)

(56) References Cited

U.S. PATENT DOCUMENTS 7,858,517 B2   12/2010   Sato et al.
7,948,008 B2    5/2011   Liu et al.
(Continued)

FOREIGN PATENT DOCUMENTS

KR   10-2007-0002625 A   1/2007
KR   10-2016-0020042 A   2/2016

*Primary Examiner* — Shahed Ahmed
(74) *Attorney, Agent, or Firm* — Lee IP Law, PC

(57) ABSTRACT

A semiconductor device includes a gate electrode extending in a first direction on a substrate, a first active pattern extending in a second direction intersecting the first direction on the substrate to penetrate the gate electrode, the first active pattern including germanium, an epitaxial pattern on a side wall of the gate electrode, a first semiconductor oxide layer between the first active pattern and the gate electrode, and including a first semiconductor material, and a second semiconductor oxide layer between the gate electrode and the epitaxial pattern, and including a second semiconductor material. A concentration of germanium of the first semiconductor material may be less than a concentration of germanium of the first active pattern, and the concentration of germanium of the first semiconductor material may be different from a concentration of germanium of the second semiconductor material.

20 Claims, 36 Drawing Sheets

(51) Int. Cl.
  *H01L 29/423* (2006.01)
  *H01L 29/66* (2006.01)
  *H01L 21/02* (2006.01)
  *H01L 21/30* (2006.01)

(52) U.S. Cl.
  CPC .. *H01L 21/02532* (2013.01); *H01L 21/02603* (2013.01); *H01L 21/3003* (2013.01); *H01L 29/0673* (2013.01); *H01L 29/42392* (2013.01); *H01L 29/66545* (2013.01); *H01L 29/66742* (2013.01); *H01L 29/78609* (2013.01); *H01L 29/78684* (2013.01)

(58) Field of Classification Search
  CPC ........... H01L 21/02603; H01L 21/3003; H01L 29/0673; H01L 29/42392; H01L 29/66545; H01L 29/66742; H01L 29/78609; H01L 29/78684; H01L 21/02601–02606; H01L 29/0669–068; H01L 29/7853–2029/7858
  See application file for complete search history.

(56) References Cited

U.S. PATENT DOCUMENTS

| | | | |
|---|---|---|---|
| 9,184,269 B2 | 11/2015 | Ching et al. | |
| 9,425,259 B1 | 8/2016 | Suk et al. | |
| 9,514,990 B2 | 12/2016 | Liu et al. | |
| 9,583,491 B2 | 2/2017 | Kim et al. | |
| 2015/0104918 A1* | 4/2015 | Liu | H01L 29/42392 438/283 |
| 2016/0027929 A1* | 1/2016 | Cheng | H01L 29/78696 257/9 |
| 2017/0025314 A1 | 1/2017 | Witters et al. | |
| 2017/0040456 A1 | 2/2017 | Jangjian et al. | |
| 2017/0053982 A1 | 2/2017 | Cai et al. | |
| 2019/0067452 A1* | 2/2019 | Cheng | H01L 29/0847 |

* cited by examiner

SEMICONDUCTOR DEVICE HAVING GERMANIUM CONTAINING ACTIVE PATTERN AND METHOD FOR FABRICATING THE SAME

CROSS-REFERENCE TO RELATED APPLICATION

Korean Patent Application No. 10-2018-0021804, filed on Feb. 23, 2018, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

A multi-gate transistor may be implemented as a scaling technique to increase the degree of integration of a semiconductor device. A multi-gate transistor may include a silicon body having a fin- or nanowire-shape on a substrate, and gates on the surface of the silicon body.

SUMMARY

Embodiments are directed to a semiconductor device comprising a gate electrode extending in a first direction on a substrate, a first active pattern extending in a second direction intersecting the first direction on the substrate to penetrate the gate electrode, the first active pattern including germanium (Ge), an epitaxial pattern on a side wall of the gate electrode, a first semiconductor oxide layer between the first active pattern and the gate electrode, and including a first semiconductor material, and a second semiconductor oxide layer between the gate electrode and the epitaxial pattern, and including a second semiconductor material, wherein a concentration of germanium (Ge) of the first semiconductor material is less than a concentration of germanium (Ge) of the first active pattern, and wherein the concentration of germanium (Ge) of the first semiconductor material is different from a concentration of germanium (Ge) of the second semiconductor material.

According to aspects of the present inventive concept, there is provided a semiconductor device comprising a first active pattern disposed above and spaced apart from a substrate, the first active pattern including germanium (Ge), a first gate electrode between the substrate and the first active pattern, a first epitaxial pattern disposed on side walls of the first active pattern and side walls of the first gate electrode, a first semiconductor oxide layer between the first active pattern and the first gate electrode, and including a first semiconductor material, and a second semiconductor oxide layer between the first gate electrode and the first epitaxial pattern, and including a second semiconductor material, wherein a concentration of germanium (Ge) of the first semiconductor material is less than a concentration of germanium (Ge) of the first active pattern, and wherein the concentration of germanium (Ge) of the first semiconductor material is different from a concentration of germanium (Ge) of the second semiconductor material.

According to aspects of the present inventive concept, there is provided a semiconductor device comprising a gate electrode extending in a first direction on a substrate, an active pattern extending in a second direction intersecting the first direction on the substrate to penetrate the gate electrode, the active pattern including germanium (Ge), an epitaxial pattern on a side wall of the gate electrode, the epitaxial pattern including silicon germanium (SiGe), a first semiconductor oxide layer between the active pattern and the gate electrode and including silicon oxide, and a second semiconductor oxide layer between the gate electrode and the epitaxial pattern and including silicon germanium oxide.

BRIEF DESCRIPTION OF THE DRAWINGS

Features will become apparent to those of skill in the art by describing in detail example embodiments with reference to the attached drawings in which.

DETAILED DESCRIPTION

Figure 1:
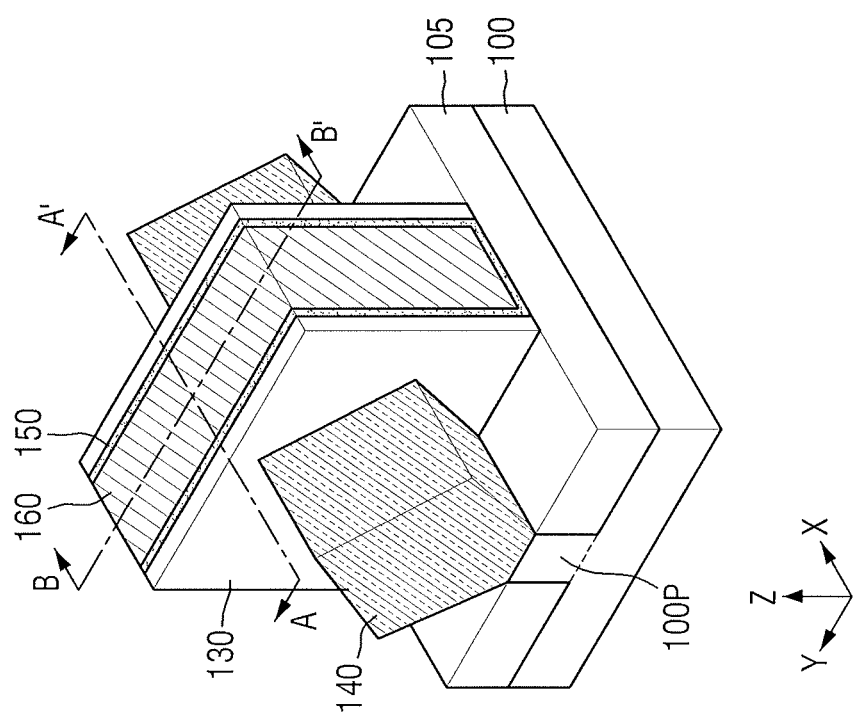
FIG. 1 illustrates a perspective view of a semiconductor device according to an example embodiment.

Embodiments and advantages thereof will be apparent to those of skill in the art based on the disclosure set forth herein.

Hereinafter, a semiconductor device according to an example embodiment will be described with reference to FIGS. 1 to 16. For convenience, isolation layers obtained by a STI (shallow trench isolation) process formed in the substrate, etc. are not shown in the drawings.

Figure 2:
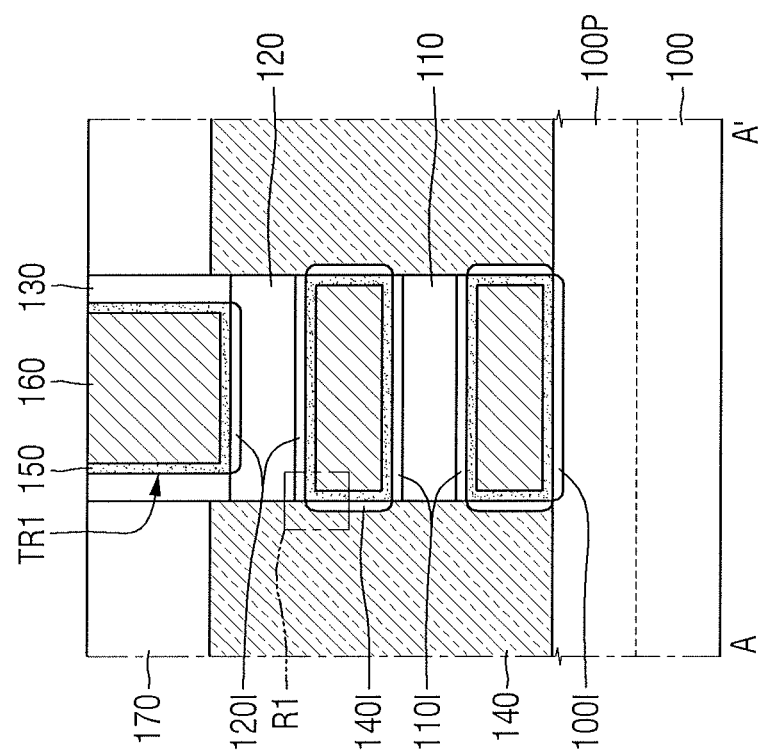
FIG. 2 illustrates a cross-sectional view taken along line A-A' of FIG. 1.

FIG. 1 illustrates a perspective view of a semiconductor device according to an example embodiment. FIG. 2 illustrates a cross-sectional view taken along line A-A' of FIG. 1. FIGS. 3 to 6 illustrate enlarged views of portion R1 of FIG. 2. FIGS. 7 to 10 illustrate cross-sectional views taken along line B-B' of FIG. 1.

It is to be noted that an interlayer dielectric layer 170 is not shown in FIG. 1 for convenience.

Referring to FIGS. 1 to 10, a semiconductor device according to an example embodiment may include a substrate 100, a field insulating layer 105, a first semiconductor oxide layer 100I, a first active pattern 110, a second semiconductor oxide layer 110I, a second active pattern 120, a third semiconductor oxide layer 120I, a first gate insulating layer 150, a first gate electrode 160, first gate spacers 130, a first epitaxial pattern 140, a fourth semiconductor oxide layer 140I, and an interlayer dielectric layer 170.

The substrate 100 may be a bulk silicon substrate or a SOI (silicon-on-insulator) substrate. In another implementation, the substrate 100 may be a silicon substrate or may be a substrate made of other materials, such as silicon germanium (SiGe), SGOI (silicon germanium on insulator), indium antimonide (InSb), lead-telluride (PbTe) compound, indium arsenide (InAs), indium phosphide (InP), gallium arsenide (GaAs) and gallium antimonide (GaSb). In another implementation, the substrate 100 may be formed by growing an epitaxial layer on a base substrate. In the following description, it is assumed that the substrate 100 includes germanium (Ge).

The substrate 100 may include a first fin-shaped protrusion 100P. The first fin-shaped protrusion 100P may protrude from the upper surface of the substrate 100 and may extend in a first direction X. The first fin-shaped protrusion 100P may be formed by, for example, etching a part of the substrate 100, or may be an epitaxial layer grown from the substrate 100, etc.

The first fin-shaped protrusion 100P may include silicon (Si) or germanium (Ge), which is an elemental semiconductor material. In addition, the first fin-shaped protrusion 100P may include a compound semiconductor. For example, the first fin-shaped protrusion 100P may include a Group IV-IV compound semiconductor or a Group III-V compound semiconductor.

Examples of the group IV-IV compound semiconductor may include a binary compound or a ternary compound including at least two of carbon (C), silicon (Si), germanium (Ge) and tin (Sn), or such a compound doped with a group IV element.

Examples of the group III-V compound semiconductor may include a binary compound, a ternary compound or a quaternary compound including at least one of aluminum (Al), gallium (Ga), and indium (In) as the group III element, and at least one of phosphorous (P), arsenic (As), and antimony (Sb) as the group V element.

In an example embodiment, the first fin-shaped protrusion 100P may include germanium (Ge), which is an elemental semiconductor material. For example, the first fin-shaped protrusion 100P may include silicon germanium (SiGe) or a high concentration of germanium (Ge).

The field insulating layer 105 may be formed on the substrate 100. The field insulating layer 105 may cover at least a part of the side walls of the first fin-shaped protrusion 100P. For example, the first fin-shaped protrusion 100P may be defined by the field insulating layer 105. The side walls of the first fin-shaped protrusion 100P are shown as being entirely covered by the field insulating layer 105 in FIG. 7 for convenience.

The field insulating layer 105 may include, for example, at least one of an oxide layer, a nitride layer, an oxynitride layer, and a combination thereof.

Figure 7:
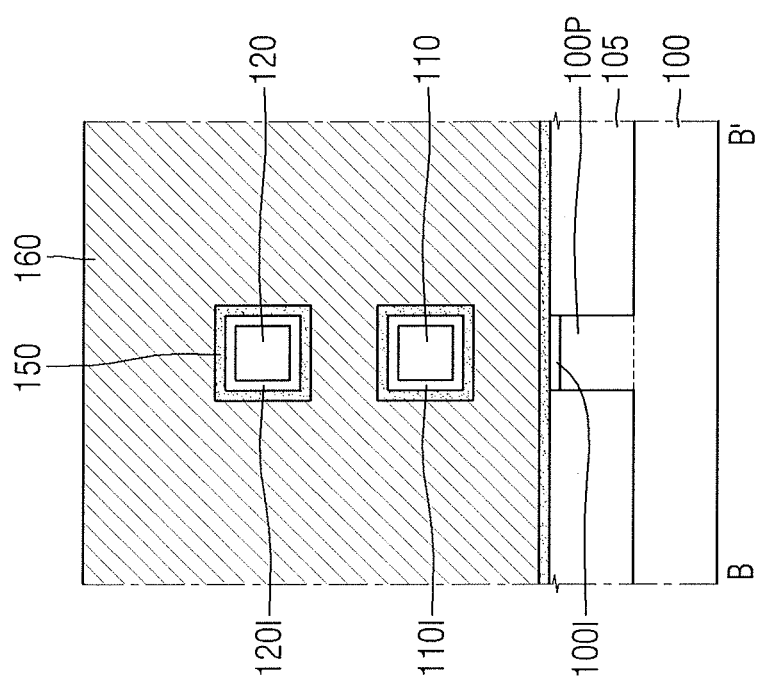
FIGS. 7 to 10 illustrate cross-sectional views taken along line B-B' of FIG. 1.

The first semiconductor oxide layer 100I may be formed on the substrate 100. In an example embodiment, the first semiconductor oxide layer 100I may extend along the profile of the outer surface of the substrate 100 exposed via the field insulating layer 105. For example, as shown in FIG. 7, the first semiconductor oxide layer 100I may be formed on the top surface of the first fin-shaped protrusion 100P exposed via the field insulating layer 105.

In an example embodiment, at least a part of the first semiconductor oxide layer 100I may be buried in the substrate 100. For example, as shown in FIG. 2, the first semiconductor oxide layer 100I may have a shape that is buried in the first fin-shaped protrusion 100P.

In another implementation, the first semiconductor oxide layer 100I may not be formed on the field insulating layer 105. For example, the first semiconductor oxide layer 100I may not be formed on the upper surface of the field insulating layer 105.

The first semiconductor oxide layer 100I may include a first semiconductor material. The first semiconductor material may include a semiconductor material having a bond energy greater than Ge—Ge bonds. For example, the first semiconductor material may include silicon (Si) or silicon germanium (SiGe). Thus, for example, the first semiconductor oxide layer 100I may include silicon oxide or silicon germanium oxide.

In an example embodiment, the first semiconductor material may be obtained by removing at least some of germanium (Ge) from the material of the substrate 100. For example, the first semiconductor material may be obtained by removing at least some of germanium (Ge) from the material of the surface of the first fin-shaped protrusion 100P. Accordingly, the concentration of germanium (Ge) of the first semiconductor material may be less than the concentration of germanium (Ge) of the substrate 100. When the substrate 100 includes silicon germanium (SiGe), the concentration of silicon (Si) of the first semiconductor material may be greater than the concentration of silicon (Si) of the substrate 100. Further details will be given below with reference to FIGS. 27 to 29.

The first active pattern 110 may be formed on the substrate 100. In addition, the first active pattern 110 may be spaced apart from the substrate 100. Like the first fin-shaped protrusion 100P, the first active pattern 110 may extend in the first direction X.

The first active pattern 110 may be spaced apart from the first fin-shaped protrusion 100P above the first fin-shaped protrusion 100P. In addition, the first active pattern 110 may vertically overlap the first fin-shaped protrusion 100P. For example, the first active pattern 110 may overlap the first fin-shaped protrusion 100P in a third direction Z. Accordingly, the first active pattern 110 is formed not above the field insulating layer 105 but above the first fin-shaped protrusion 100P.

The first active pattern 110 may include germanium (Ge), which is an elemental semiconductor material. For example, the first active pattern 110 may include silicon germanium (SiGe) or a high concentration of germanium (Ge).

The second active pattern 120 may be formed above the first active pattern 110. In addition, the second active pattern 120 may be spaced apart from the first active pattern 110. Like the first fin-shaped protrusion 100P and the first active pattern 110, the second active pattern 120 may extend in the first direction X. The second active pattern 120 may vertically overlap the first active pattern 110 above the first active pattern 110. For example, the second active pattern 120 may overlap with the first active pattern 110 in the third direction Z.

The second active pattern 120 may include germanium (Ge), which is an elemental semiconductor material. For example, the second active pattern 120 may include silicon germanium (SiGe) or a high concentration of germanium (Ge).

In an example embodiment, the first active pattern 110 and the second active pattern 120 may include the same material or may include different materials. In addition, the first active pattern 110 and the second active pattern 120 may include the same material as the first fin-shaped protrusion 100P or may include a material different from the first fin-shaped protrusion 100P.

Each of the first active pattern 110 and the second active pattern 120 may be used as a channel region of a transistor.

The semiconductor device according to the present example embodiment has two active patterns, but the semiconductor device according may include one active pattern or three or more active patterns.

The second semiconductor oxide layer 110I may be formed on the first active pattern 110. In addition, the second semiconductor oxide layer 110I may surround the first active pattern 110. For example, as shown in FIG. 7, if the cross section of the first active pattern 110 has a rectangular shape, the cross section of the second semiconductor oxide layer 110I may be formed along the perimeter of the rectangular shape.

In an example embodiment, the second semiconductor oxide layer 110I may extend along the profile of the outer surface of the first active pattern 110. For example, the second semiconductor oxide layer 110I may extend substantially conformally along the outer surface of the first active pattern 110. For example, the outer surface of the second semiconductor oxide layer 110I may not include a crystal face such as a facet.

The second semiconductor oxide layer 110I may include a second semiconductor material. The second semiconductor material may include a semiconductor material having a bond energy greater than Ge—Ge bonds. For example, the second semiconductor material may include silicon (Si) or silicon germanium (SiGe). Thus, for example, the second semiconductor oxide layer 110I may include silicon oxide or silicon germanium oxide.

In an example embodiment, the second semiconductor material may be obtained by removing at least some of germanium (Ge) from the material of the first active pattern 110. For example, the second semiconductor material may be obtained by removing at least some of germanium (Ge) from the material of the surface of the first active pattern 110. Accordingly, the concentration of germanium (Ge) of the second semiconductor material may be less than the concentration of germanium (Ge) of the first active pattern 110. When the first active pattern 110 includes silicon germanium (SiGe), the concentration of silicon (Si) of the first semiconductor material may be greater than the concentration of silicon (Si) of the first active pattern 110. Additional details will be given below with reference to FIGS. 27 to 29.

The third semiconductor oxide layer 120I may be formed on the second active pattern 120. Like the second semiconductor oxide layer 110I, the third semiconductor oxide layer 120I may surround the second active pattern 120.

In an example embodiment, like the second semiconductor oxide layer 110I, the third semiconductor oxide layer 120I may extend along the profile of the outer surface of the second active pattern 120.

The third semiconductor oxide layer 120I may include a third semiconductor material. The third semiconductor material may include a semiconductor material having a bond energy greater than Ge—Ge bonds. For example, the third semiconductor material may include silicon (Si) or silicon germanium (SiGe). Thus, for example, the third semiconductor oxide layer 120I may include silicon oxide or silicon germanium oxide.

In an example embodiment, the third semiconductor material may be obtained by removing at least some of germanium (Ge) from the material of the second active pattern 120. For example, the third semiconductor material may be obtained by removing at least some of germanium (Ge) from the material of the surface of the second active pattern 120. Accordingly, the concentration of germanium (Ge) of the third semiconductor material may be less than the concentration of germanium (Ge) of the second active pattern 120. When the second active pattern 120 includes silicon germanium (SiGe), the concentration of silicon (Si) of the third semiconductor material may be greater than the concentration of silicon (Si) of the second active pattern 120. Additional details will be given below with reference to FIGS. 27 to 29.

If the first active pattern 110 and the second active pattern 120 include the same material, the second semiconductor oxide layer 110I and the third semiconductor oxide layer 120I may include the same material. If the first active pattern 110 and the second active pattern 120 include the different materials, the second semiconductor oxide layer 110I and the third semiconductor oxide layer 120I may include the different materials.

If the first active pattern 110 and the second active pattern 120 include the same material, the second semiconductor oxide layer 110I and the third semiconductor oxide layer 120I may include the same material as the first semiconductor oxide layer 100I. If the first active pattern 110 and the second active pattern 120 include a material different from the material of the first fin-shaped protrusion 100P, the second semiconductor oxide layer 110I and the third semiconductor oxide layer 120I may include a material different from the first semiconductor oxide layer 100I.

The first gate insulating layer 150 may be formed along the periphery of the first active pattern 110 and along the periphery of the second active pattern 120. Accordingly, the second semiconductor oxide layer 110I may be interposed between the first active pattern 110 and the first gate insulating layer 150. The third semiconductor oxide layer 120I may be interposed between the second active pattern 120 and the first gate insulating layer 150. In addition, the first gate insulating layer 150 may be formed on the first semiconductor oxide layer 100I and the field insulating layer 105 as well. Accordingly, the first semiconductor oxide layer 100I may be interposed between the substrate 100 and the first gate insulating layer 150. For example, the first semiconductor oxide layer 100I may be interposed between the first fin-shaped protrusion 100P and the first gate insulating layer 150.

In an example embodiment, the first gate insulating layer 150 may come in direct contact with the first semiconductor oxide layer 100I, the second semiconductor oxide layer 110I, and the third semiconductor oxide layer 120I.

For example, the first gate insulating layer 150 may include at least one of silicon oxide, silicon oxynitride, silicon nitride, and a high-k dielectric material having a dielectric constant greater than that of silicon oxide. The high-k dielectric material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

The first gate electrode 160 may be formed on the substrate 100. In addition, the first gate electrode 160 may intersect the first active pattern 110 and the second active pattern 120. For example, the first gate electrode 160 may extend in the second direction Y.

The first gate electrode 160 may surround the first gate insulating layer 150. That is, the first gate electrode 160 may surround the periphery of the first active pattern 110 and the periphery of the second active pattern 120. Accordingly, the first active pattern 110 and the second active pattern 120 may penetrate the first gate electrode 160. In addition, the first gate electrode 160 may also be formed in a space between the first active pattern 110 and the substrate 100.

The first gate electrode 160 may include a conductive material. Although the first gate electrode 160 is shown as a single layer, the first gate electrode 160 may be made up of multiple layers. For example, the first gate electrode 160 may include a work function conductive layer for adjusting a work function, and a filling conductive layer used to fill a space formed by the work function conductive layer.

In an example embodiment, the first gate electrode 160 may include at least one of TiN, WN, TaN, Ru, TiC, TaC, Ti, Ag, Al, TiAl, TiAlN, TiAlC, TaCN, TaSiN, Mn, Zr, W, Al, and a combination thereof. In another implementation, the first gate electrode 160 may include silicon (Si), silicon germanium (SiGe), or the like instead of a metal. The first gate electrode 160 may be formed via a replacement process, for example.

The first gate spacers 130 may be formed on at least one side wall of the first gate electrode 160 extending in the second direction Y. For example, the first gate spacers 130 may be formed on both side walls of the first gate electrode 160, respectively, facing each other. The first gate spacers 130 may define a first trench TR1 that intersects the first active pattern 110 and the second active pattern 120. For example, the first trench TR1 may extend in the second direction Y.

The first gate insulating layer 150 may extend along the inner side walls of the first gate spacers 130. For example, the first gate insulating layer 150 may extend along the side walls and the bottom surface of the first trench TR1.

The first gate spacers 130 may be disposed at both ends of each of the first active pattern 110 and the second active pattern 120. For example, the first gate spacers 130 may come in contact with the entire perimeter of the ends of the first active pattern 110 and the entire perimeter of the ends of the second active pattern 120. For example, the first active pattern 110 and the second active pattern 120 may cross or penetrate the first gate spacers 130.

The first gate spacers 130 may include, for example, at least one of silicon nitride (SiN), silicon oxynitride (SiON), silicon oxide ($SiO_2$), silicon oxycarbonitride (SiOCN), and a combination thereof.

In an example embodiment, a part of the semiconductor oxide layers may be buried in the respective active patterns between the first gate spacers 130. For example, as shown in FIG. 2, a part of the second semiconductor oxide layer 110I may be buried in the second active pattern 120 between the second gate spacers 230.

The first epitaxial pattern 140 may be formed on at least one side wall of the first gate electrode 160. In addition, the first epitaxial pattern 140 may come in contact with the first active pattern 110 and the second active pattern 120. For example, the first epitaxial pattern 140 may be formed on the side walls of the first active pattern 110 and the side walls of the second active pattern 120.

The first epitaxial pattern 140 may include an epitaxial layer formed on the substrate 100. In addition, the first epitaxial pattern 140 may also be an elevated source and drain region including an upper surface that protrudes above the upper surface of the substrate 100. In an implementation, the first epitaxial pattern 140 may be an impurity region formed in the substrate 100.

As shown in FIG. 1, the cross section of the first epitaxial pattern 140 may have a diamond shape (or a pentagonal shape or a hexagonal shape), but the cross section of the first epitaxial pattern 140 may have various shapes.

When the semiconductor device according to an example embodiment is a PMOS transistor, the first epitaxial pattern 140 may include p-type impurities and impurities for preventing the diffusion of the p-type impurities. For example, the first epitaxial pattern 140 may include at least one of B, C, In, Ga, Al, and a combination thereof.

In addition, when the semiconductor device according to an example embodiment is a PMOS transistor, the first epitaxial pattern 140 may include silicon germanium (SiGe).

In another implementation, when the semiconductor device according to an example embodiment is an NMOS transistor, the first epitaxial pattern 140 may include n-type impurities and impurities for preventing the diffusion of the n-type impurities. For example, the first epitaxial pattern 140 may include at least one of P, Sb, As, and a combination thereof.

In addition, when the semiconductor device according to an example embodiment is an NMOS transistor, the first epitaxial pattern 140 may include silicon (Si).

In an example embodiment, the concentration of germanium (Ge) the first epitaxial pattern 140 may be different from the concentration of germanium (Ge) of each of the first fin-shaped protrusion 100P, the first active pattern 110, and the second active pattern 120. For example, the first epitaxial pattern 140 may include, for example, a higher proportion of germanium (Ge) than silicon (Si), for example $Si_{0.3}Ge_{0.7}$, and the first fin-shaped protrusion 100P, the first active pattern 110, and the second active pattern 120 may include a lower concentration of germanium (Ge) relative to silicon (Si), for example, an equal proportion of germanium (Ge) to silicon (Si), for example $Si_{0.5}Ge_{0.5}$.

The fourth semiconductor oxide layer 140I may be formed between the first gate insulating layer 150 and the first epitaxial pattern 140. In an example embodiment, at least a part of the first semiconductor oxide layer 100I may be buried in the first epitaxial pattern 140 adjacent to the first gate insulating layer 150. For example, as shown in FIG. 2, the fourth semiconductor oxide layer 140I may be buried in the first epitaxial pattern 140 adjacent to the first gate insulating layer 150.

The fourth semiconductor oxide layer 140I may include a fourth semiconductor material. The fourth semiconductor material may include a semiconductor material having a bond energy greater than Ge—Ge bonds. For example, the fourth semiconductor material may include silicon (Si) or silicon germanium (SiGe). Thus, for example, the fourth semiconductor oxide layer 140I may include silicon oxide or silicon germanium oxide.

In an example embodiment, the fourth semiconductor material may be obtained by removing at least some of germanium (Ge) from the material of the first epitaxial pattern 140. For example, the fourth semiconductor material may be obtained by removing at least some of germanium (Ge) from the material of the surface of the first epitaxial pattern 140 adjacent to the first gate insulating layer 150. Accordingly, the concentration of germanium (Ge) of the fourth semiconductor material may be less than the concentration of germanium (Ge) of the first epitaxial pattern 140. When the first epitaxial pattern 140 includes silicon germanium (SiGe), the concentration of silicon (Si) of the fourth semiconductor material may be greater than the concentration of silicon (Si) of the first epitaxial pattern 140. Additional details will be given below with reference to FIGS. 27 to 29.

In addition, in an example embodiment, the concentration of germanium (Ge) of the fourth semiconductor oxide layer 140I may be different from the concentration of germanium (Ge) of each of the first to third semiconductor oxide layers 100I, 110I, and 120I. For example, when the concentration of germanium (Ge) of the first epitaxial pattern 140 is different from the concentration of germanium (Ge) of the first active pattern 110, the concentration of germanium (Ge) of the fourth semiconductor material may be different from the concentration of germanium (Ge) of the second semiconductor material. For example, the fourth semiconductor material may include a greater proportion of silicon (Si) relative to germanium (Ge), for example $Si_{0.7}Ge_{0.3}$, and the second semiconductor material may include a still greater proportion of silicon (Si) to germanium (Ge), for example $Si_{0.9}Ge_{0.1}$. In another implementation, for example, the fourth semiconductor oxide layer 140I may include silicon germanium oxide, and the second semiconductor oxide layer 110I may include silicon oxide.

The interlayer dielectric layer 170 may be formed on the substrate 100. The interlayer dielectric layer 170 may surround the outer side walls of the first gate spacers 130 defining the first trench TR1.

The interlayer dielectric layer 170 may include at least one of, for example, silicon oxide, silicon nitride, silicon oxynitride, and a low-k dielectric material. The low-k dielectric material may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and a combination thereof.

Hereinafter, a variety of shapes of the semiconductor oxide layers will be described with reference to FIGS. 3 to 6. Although FIGS. 3 to 6 illustrate enlarged views of the third semiconductor oxide layer 120I as an example of the semiconductor oxide layers formed on the active patterns, it is to be understood that the description can be equally applied to the other semiconductor oxide layers. For example, the first semiconductor oxide layer 100I or the second semiconductor oxide layers 110I may also be shown enlarged together with the fourth semiconductor oxide layer 140I.

Figure 3:
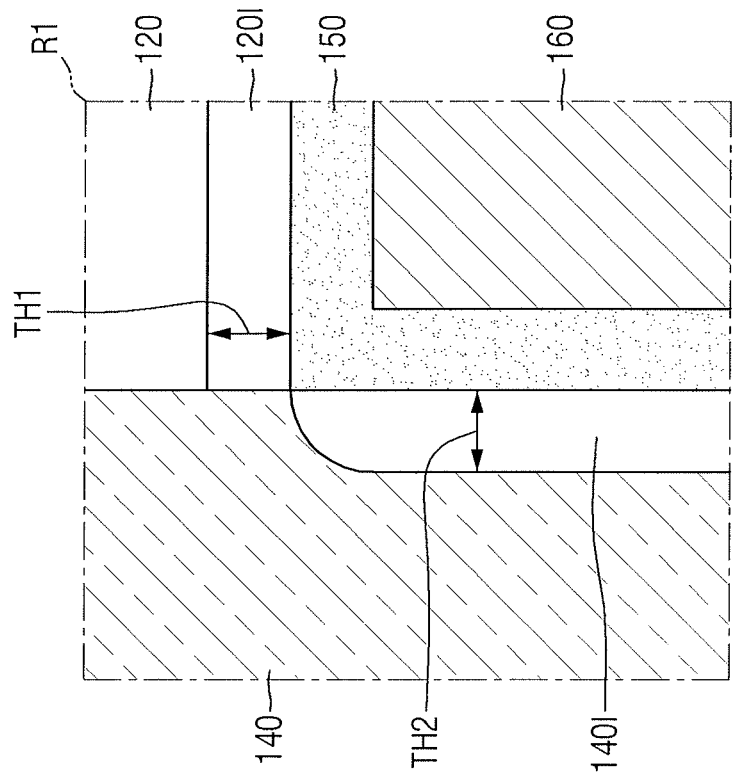
FIGS. 3 to 6 illustrate enlarged views of portion R1 of FIG. 2.

Referring to FIG. 3, in an example embodiment, the thickness of the fourth semiconductor oxide layer 140I may be different from the thickness of the semiconductor oxide layers formed on the active patterns. For example, if the second active pattern 120 and the first epitaxial pattern 140 include different materials, the first thickness TH1 of the third semiconductor oxide layer 120I may be different from the second thickness TH2 of the fourth semiconductor oxide layer 140I. In another implementation, the first thickness TH1 of the third semiconductor oxide layer 120I may be substantially equal to the second thickness TH2 of the fourth semiconductor oxide layer 140I.

Figure 4:
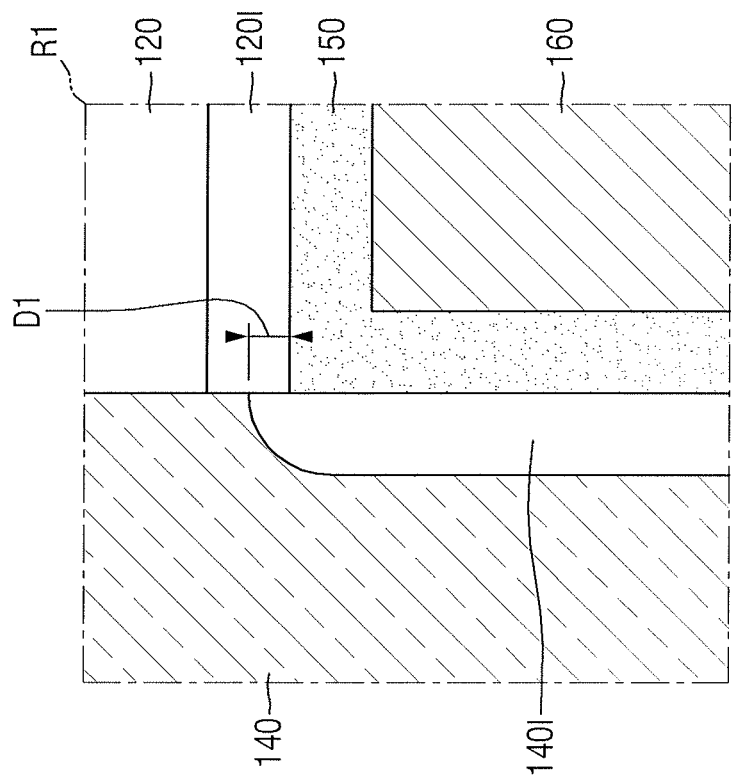

Referring to FIG. 4, in an example embodiment, a part of the fourth semiconductor oxide layer 140I may extend beyond the boundary between the third semiconductor oxide layer 120I and the first gate insulating layer 150. For example, the fourth semiconductor oxide layer 140I may overlap the third semiconductor oxide layer 120I by a first distance D1. Thus, the fourth semiconductor oxide layer 140I and the third semiconductor oxide layer 120I may be in direct contact with each other. Such shape may be from the oxidation process described below with reference to FIGS. 30 and 31.

Figure 5:
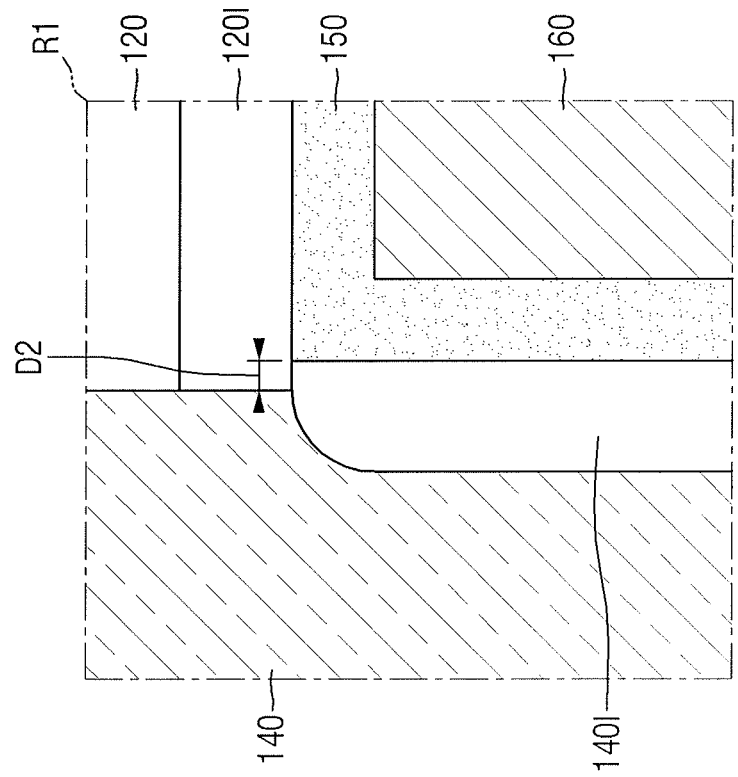

Referring to FIG. 5, in an example embodiment, a part of the fourth semiconductor oxide layer 140I may extend beyond the boundary between the third semiconductor oxide layer 120I and the first epitaxial pattern 140. For example, the fourth semiconductor oxide layer 140I may overlap the third semiconductor oxide layer 120I by a second distance D1. Thus, the fourth semiconductor oxide layer 140I and the third semiconductor oxide layer 120I may be in direct contact with each other. Such shape may be from the oxidation process described below with reference to FIGS. 30 and 31.

Figure 6:
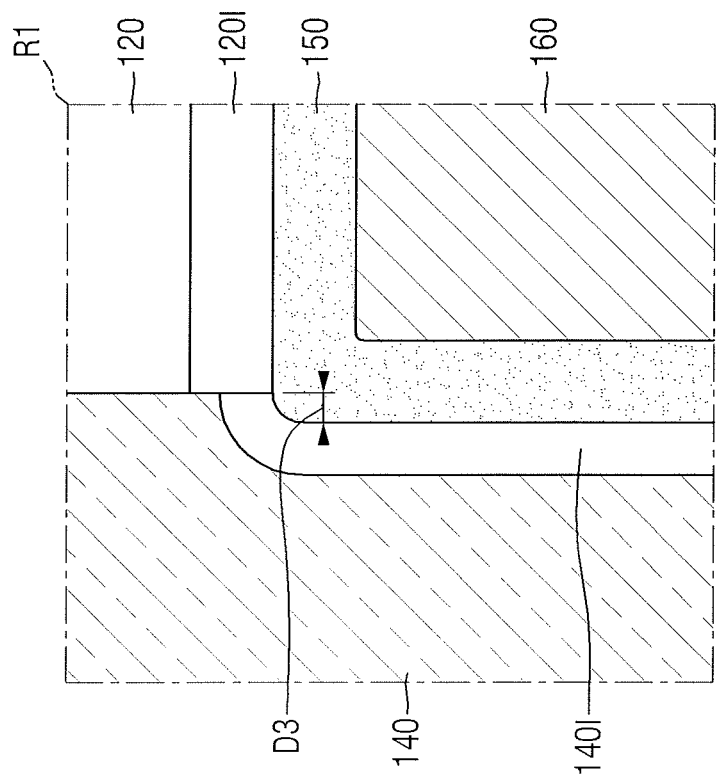

Referring to FIG. 6, in an example embodiment, a part of the fourth semiconductor oxide layer 140I may be recessed from the boundary between the second active pattern 120 and the first epitaxial pattern 140. For example, the fourth semiconductor oxide layer 140I may be recessed from the boundary between the second active pattern 120 and the first epitaxial pattern 140 with a step difference of a third distance D3. Such shape may be from the hydro-treating process described below with reference to FIGS. 27 and 28.

Hereinafter, a variety of shapes of the fin-shaped protrusion and the active pattern will be described with reference to FIGS. 8 to 10.

Figure 8:
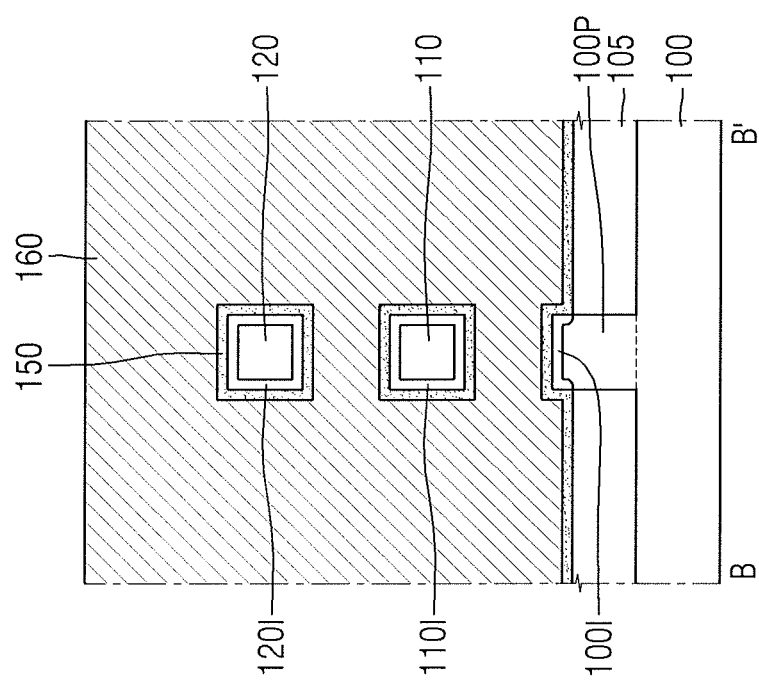

Referring to FIG. 8, the field insulating layer 105 may cover a part of the side walls of the first fin-shaped protrusion 100P. Thus, the other part of the side walls of the first fin-shaped protrusion 100P may be exposed via the field insulating layer 105.

In an example embodiment, the first semiconductor oxide layer 100I may extend along the profile of the outer surface of the substrate 100 exposed via the field insulating layer 105. For example, as shown in FIG. 8, the first semiconductor oxide layer 100I may be formed on the top surface and the side walls of the first fin-shaped protrusion 100P exposed via the field insulating layer 105. In addition, the first semiconductor oxide layer 100I may be buried in the first fin-shaped protrusion 100P.

In another implementation, the first semiconductor oxide layer 100I may not be formed on the field insulating layer 105. For example, as shown in FIG. 8, the first semiconductor oxide layer 100I may not be formed on the upper surface of the field insulating layer 105.

Figure 9:
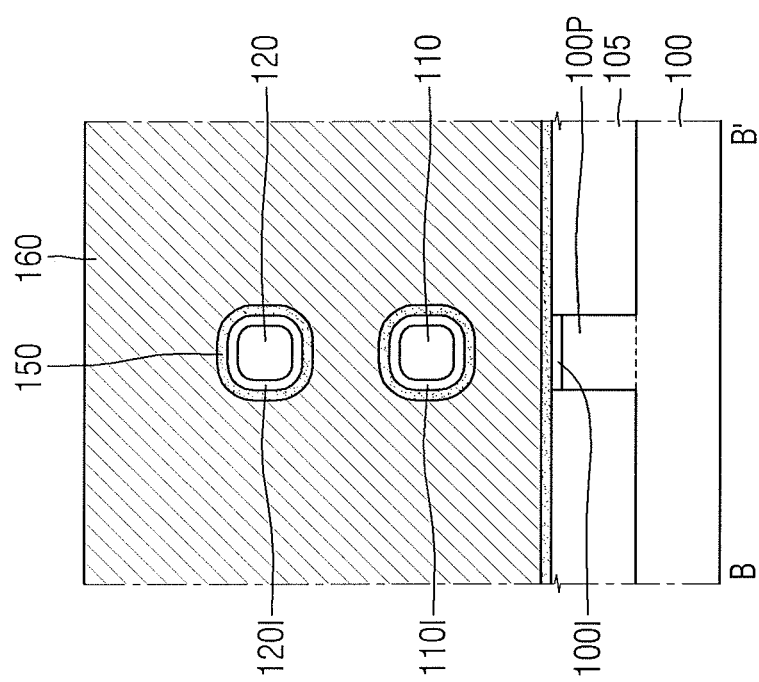

Referring to FIG. 9, the cross section of each of the first active pattern 110 and the second active pattern 120 may not have a rectangular shape.

For example, as shown in FIG. 9, the cross section of each of the first active pattern 110 and the second active pattern 120 may have a shape including a combination of straight lines and curves. In another implementation, for example, the cross section of each of the first active pattern 110 and the second active pattern 120 may be circular.

In either case, the second semiconductor oxide layer 110I and the third semiconductor oxide layer 120I may extend along the profiles of the outer surfaces of the first active pattern 110 and the second active pattern 120, respectively. For example, the second semiconductor oxide layer 110I and the third semiconductor oxide layer 120I may extend substantially conformally along the outer surfaces of the first active pattern 110 and the second active pattern 120, respectively, and may form a shape including a combination of straight lines and curved lines. For example, the outer surfaces of the second semiconductor oxide layer 110I and the third semiconductor oxide layer 120I may not include a crystal face such as a facet.

Figure 10:
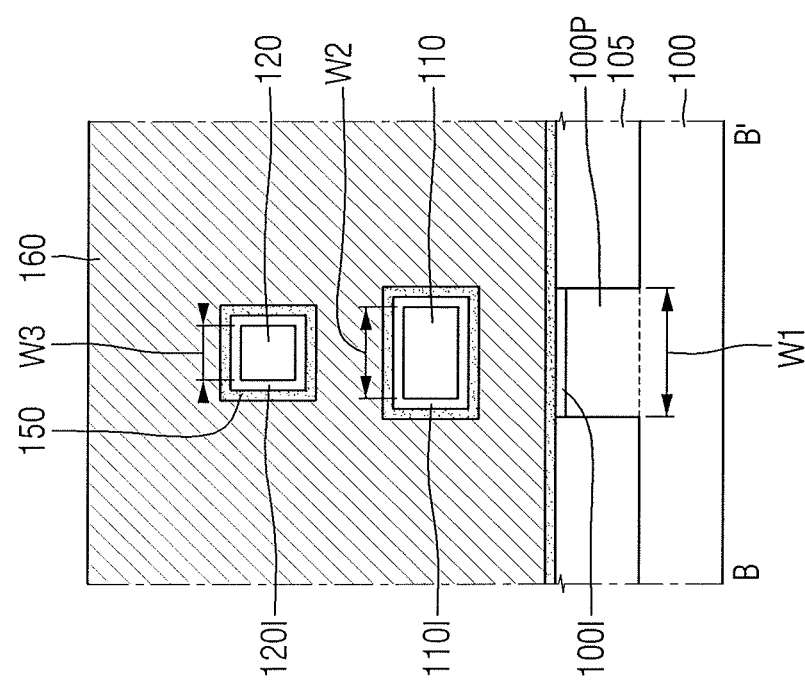

Referring to FIG. 10, the first fin-shaped protrusion 100P, the first active pattern 110 and the second active pattern 120 may have different widths.

For example, as shown in the drawings, a first width W1 of the first fin-shaped protrusion 100P, a second width W2 of the first active pattern 110 and a third width W3 of the second active pattern 120 may be different from one another. For example, the second width W2 may be less than the first width W1, and the third width W3 may be less than the second width W2. Such shape may be from the oxidation process described below with reference to FIGS. 19 and 20. In other implementations, the first width W1, the second width W2 and the third width W3 may have a variety of values.

A semiconductor device having a channel including germanium (Ge) may provide excellent carrier mobility and a low band gap, and may be used for high performance and low power devices. However, the germanium oxide formed on the surface of the channel including germanium (Ge) may be somewhat instable and thus may deteriorate characteristics and reliability of the semiconductor device. In contrast, in a semiconductor device according to an example embodiment, a semiconductor oxide layer having a reduced concentration of germanium (Ge) may be disposed on the surface of the active patterns including germanium (Ge), which may enhance performance and reliability of the semiconductor device.

In an example embodiment, on the first active pattern 110 and the second active pattern 120, the second semiconductor oxide layer 110I and the third semiconductor oxide layer 120I having a reduced concentration of germanium (Ge) may be provided.

Further, in the semiconductor device according to an example embodiment, a semiconductor oxide layer having a reduced concentration of germanium (Ge) may be disposed between the gate electrode and the source and drain region, so that leakage current may be reduced. For example, the fourth semiconductor oxide layer 140I may reduce leakage current generated by the first gate electrode 160 and the first epitaxial pattern 140.

Figure 11:
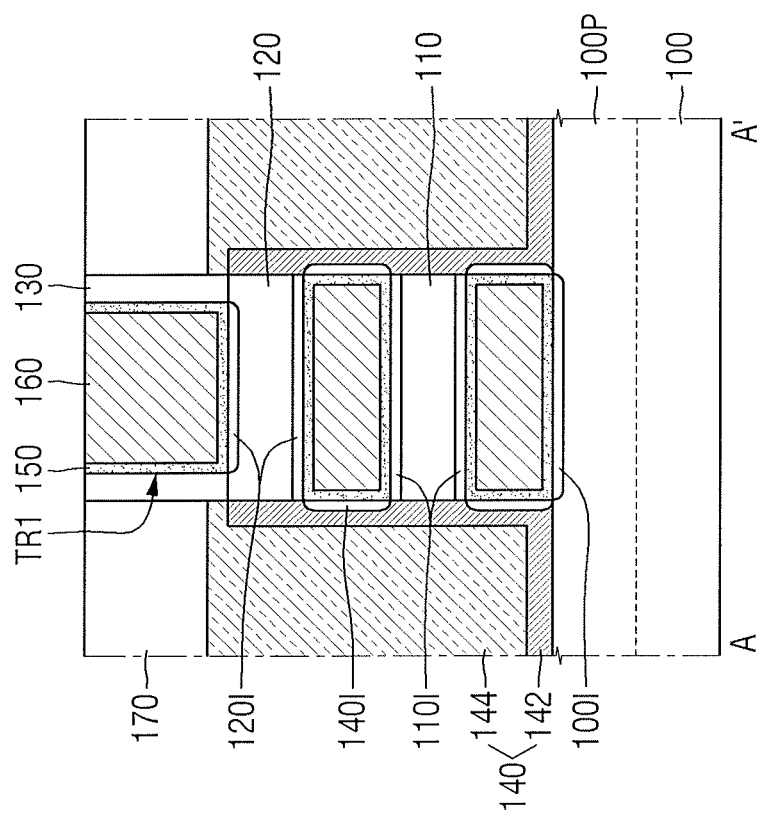
FIG. 11 illustrates a cross-sectional view of a semiconductor device according to an example embodiment.

FIG. 11 illustrates a cross-sectional view of a semiconductor device according to an example embodiment. Redundant descriptions on identical functions and elements described above with reference to FIGS. 1 to 10 may be omitted for convenience. As used herein, the term "identical" refers to having the same design and being made in the same manner within appropriate manufacturing tolerances.

Referring to FIG. 11, the first epitaxial pattern 140 may be made up of multiple layers.

For example, the first epitaxial pattern 140 may include a first epitaxial layer 142 formed on the substrate 100 and a second epitaxial layer 144 formed on the first epitaxial layer 142.

The first epitaxial layer 142 may be formed on the first fin-shaped protrusion 100P, the first active pattern 110, and the second active pattern 120. The first epitaxial layer 142 may be formed, for example, by epitaxial growth. The first epitaxial layer 142 may work as a seed layer for growing the first epitaxial pattern 140.

The second epitaxial layer 144 may be formed on the first epitaxial layer 142. As shown in FIG. 11, the second epitaxial layer 144 may be formed so that the trench formed in the substrate 100 is filled with it.

In an example embodiment, at least a part of the fourth semiconductor oxide layer 140I may be buried in the first epitaxial layer 142. In an example embodiment, the fourth semiconductor material may be obtained by removing at least a part of germanium (Ge) from the material of the first epitaxial layer 142.

Figure 12:
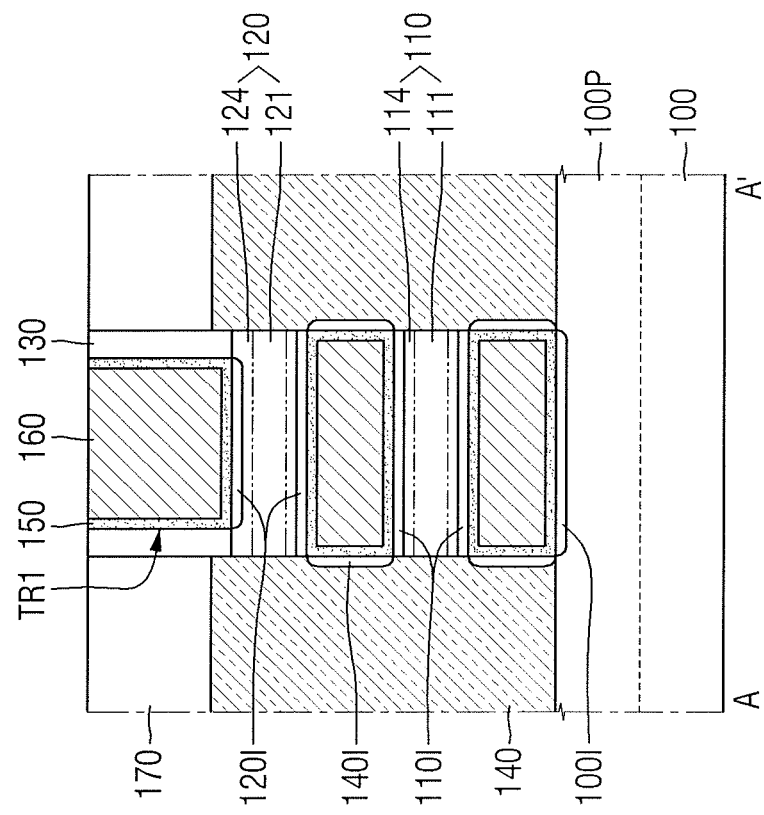
FIGS. 12 and 13 illustrate cross-sectional views of semiconductor devices according to an example embodiment.
Figure 13:
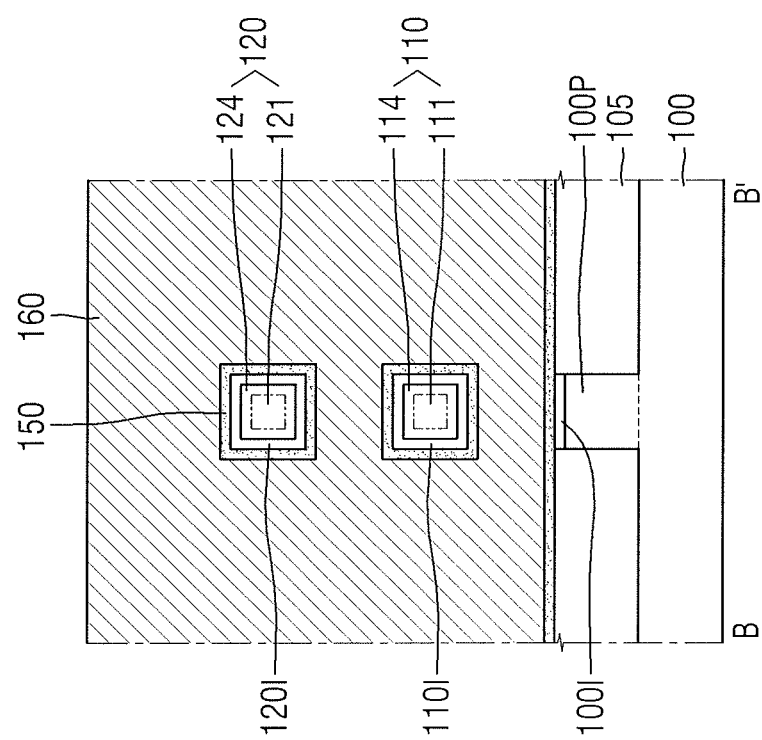

FIGS. 12 and 13 illustrate cross-sectional views of semiconductor devices according to an example embodiment. Redundant descriptions on identical functions and elements described above with reference to FIGS. 1 to 10 may be omitted for convenience.

Referring to FIGS. 12 and 13, each of the first active pattern 110 and the second active pattern 120 may be made up of multiple layers.

For example, the first active pattern 110 may include a first semiconductor layer 111 and a second semiconductor layer 114, and the second active pattern 120 may include a third semiconductor layer 121 and a second active pattern 120. The first semiconductor layer 111 may be the center portion of the first active pattern 110, and the second semiconductor layer 114 may surround the first semiconductor layer 111. The third semiconductor layer 121 may be the center portion of the second active pattern 120, and the fourth semiconductor layer 124 may surround the third semiconductor layer 121.

In an example embodiment, the concentration of germanium (Ge) of the first semiconductor layer 111 may be greater than the concentration of germanium (Ge) of the second semiconductor layer 114. The concentration of germanium (Ge) of the third semiconductor layer 121 may be greater than the concentration of germanium (Ge) of the fourth semiconductor layer 124. For example, the first semiconductor layer 111 and the third semiconductor layer 121 may include a high concentration of germanium (Ge), and the second semiconductor layer 114 and the fourth semiconductor layer 124 may include silicon germanium (SiGe).

Although the boundary between the first semiconductor layer 111 and the second semiconductor layer 114 and the boundary between the third semiconductor layer 121 and the fourth semiconductor layer 124 are shown in FIGS. 12 and 13, the concentration of germanium (Ge) of the first active pattern 110 may gradually increase away from the second semiconductor oxide layer 110I. In another implementation, for example, the concentration of germanium (Ge) of the second active pattern 120 may gradually increase away from the third semiconductor oxide layer 120I.

Figure 14:
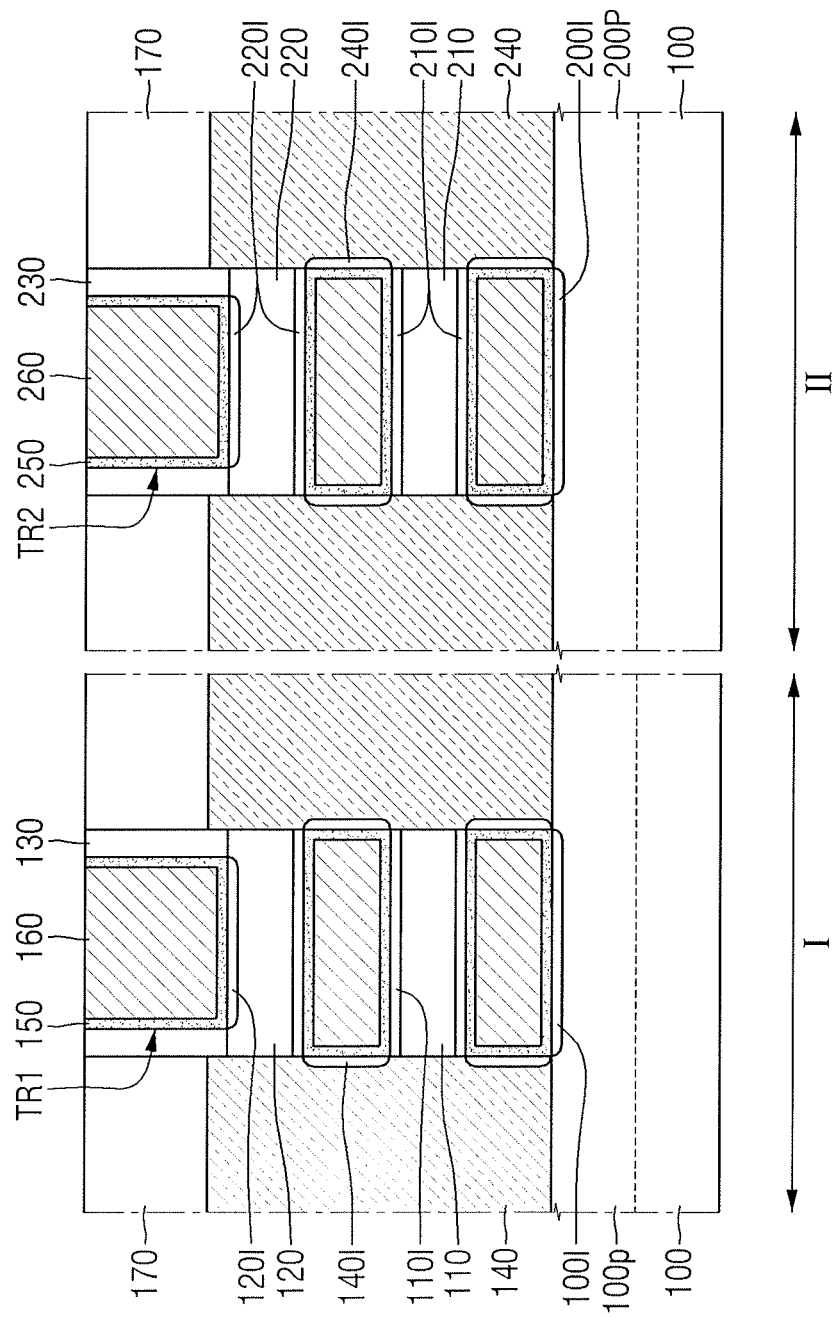
FIG. 14 illustrates a cross-sectional view of a semiconductor device according to an example embodiment.

FIG. 14 illustrates a cross-sectional view for illustrating a semiconductor device according to an example embodiment. Redundant descriptions on identical functions and elements described above with reference to FIGS. 1 to 10 may be omitted for convenience.

Referring to FIG. 14, in a semiconductor device according to an example embodiment, the substrate 100 may include a first area I and a second area II. The first area I and the second area II may be spaced apart from each other or may be connected to each other. A transistor formed in the first area I may be of the same conductivity type as or of a different conductivity type from a transistor formed in the second area II.

Each of the first area I and the second area II may be, for example, one of a logic area, an SRAM area, and an input/output (IO) area. Thus, the first area I and the second area II may perform the same function or different functions.

The semiconductor device formed in the first area I of the substrate 100 according to an example embodiment is substantially identical to the semiconductor device according to FIGS. 1 to 10; and, therefore, a redundant description may be omitted.

According to an example embodiment, the semiconductor device formed in the second area II of the substrate 100 may include a second fin-shaped protrusion 200P, a third active pattern 210, a fourth active pattern 220, a second gate insulating layer 250, a second gate electrode 260, second gate spacers 230, a second epitaxial pattern 240, a fifth semiconductor oxide layer 200I, a sixth semiconductor oxide layer 210I, a seventh semiconductor oxide layer 220I, and an eighth semiconductor oxide layer 240I.

The second fin-shaped protrusion 200P may protrude from the upper surface of the substrate 100 and may extend in a direction. The second fin-shaped protrusion 200P may be formed by etching a part of the substrate 100 or may be an epitaxial layer grown from the substrate 100.

The third active pattern 210 may be formed on the substrate 100. In addition, the third active pattern 210 may be spaced apart from the substrate 100. Like the second fin-shaped protrusion 200P, the third active pattern 210 may extend in a direction.

The fourth active pattern 220 may be formed above the third active pattern 210. In addition, the fourth active pattern 220 may be spaced apart from the third active pattern 210. Like the second fin-shaped protrusion 200P and the third active pattern 210, the fourth active pattern 220 may extend in a direction.

The third active pattern 210 and the fourth active pattern 220 may extend in the same direction as or in different directions from the first active pattern 110 and the second active pattern 120.

In addition, each of the third active pattern 210 and the fourth active pattern 220 may include the same material as or a different material from that of the first active pattern 110 and the second active pattern 120.

The second gate electrode 260 may be formed on the substrate 100. In addition, the second gate electrode 260 may intersect the third active pattern 210 and the fourth active pattern 220.

The second gate electrode 260 may cover the third active pattern 210 and the fourth active pattern 220. Accordingly, the third active pattern 210 and the fourth active pattern 220 may penetrate the second gate electrode 260.

The second gate spacers 230 may be formed on at least one side walls of the second gate electrode 260. In addition, the second gate spacers 230 may define a second trench TR2 that intersects the third active pattern 210 and the fourth active pattern 220.

The second gate spacers 230 may be disposed at both ends of each of the third active pattern 210 and the fourth active pattern 220. In an example embodiment, the third active pattern 210, the fourth active pattern 220, and the second gate electrode 260 may penetrate the second gate spacer 230.

The second gate insulating layer 250 may be interposed between the third active pattern 210 and the second gate electrode 260 and between the fourth active pattern 220 and the second gate electrode 260. The second gate insulating layer 250 may cover the third active pattern 210 and the fourth active pattern 220. In addition, like the first gate insulating layer 150, the second gate insulating layer 250 may also be formed on the upper surface of the field insulating layer 105 and on the second fin-shaped protrusion 200P.

The second gate insulating layer 250 may also extend along the inner wall of the second gate spacers 230. For example, the second gate insulating layer 250 may extend along the side walls and the bottom surface of the second trench TR2.

The second epitaxial pattern 240 may be formed on at least one side wall of the second gate electrode 260. In addition, the second epitaxial pattern 240 may come in contact with the third active pattern 210 and the fourth active pattern 220.

The fifth semiconductor oxide layer 200I may be interposed between the second fin-shaped protrusion 200P and the second gate insulating layer 250. The fifth semiconductor oxide layer 200I may include a fifth semiconductor material. The fifth semiconductor material may include a semiconductor material having a bond energy greater than Ge—Ge bonds.

In an example embodiment, the fifth semiconductor material may be obtained by removing at least some of germanium (Ge) from the material of the substrate 100. For example, the fifth semiconductor material may be obtained by removing at least some of germanium (Ge) from the material of the surface of the second fin-shaped protrusion 200P. Accordingly, the concentration of germanium (Ge) of the fifth semiconductor material may be less than the concentration of germanium (Ge) of the substrate 100.

The sixth semiconductor oxide layer 210I may be interposed between the third active pattern 210 and the second gate insulating layer 250. The sixth semiconductor oxide layer 210I may include a sixth semiconductor material. The sixth semiconductor material may include a semiconductor material having a bond energy greater than Ge—Ge bonds.

In an example embodiment, the sixth semiconductor material may be obtained by removing at least some of germanium (Ge) from the material of the third active pattern 210. For example, the sixth semiconductor material may be obtained by removing at least some of germanium (Ge) from the material of the surface of the third active pattern 210. Accordingly, the concentration of germanium (Ge) of the sixth semiconductor material may be less than the concentration of germanium (Ge) of the third active pattern 210.

The seventh semiconductor oxide layer 220I may be interposed between the fourth active pattern 220 and the second gate insulating layer 250. The seventh semiconductor oxide layer 220I may include a seventh semiconductor material. The seventh semiconductor material may include a semiconductor material having a bond energy greater than Ge—Ge bonds.

In an example embodiment, the seventh semiconductor material may be obtained by removing at least some of germanium (Ge) from the material of the fourth active pattern 220. For example, the seventh semiconductor material may be obtained by removing at least some of germanium (Ge) from the material of the surface of the fourth active pattern 220. Accordingly, the concentration of germanium (Ge) of the seventh semiconductor material may be less than the concentration of germanium (Ge) of the fourth active pattern 220.

The eighth semiconductor oxide layer 240I may be interposed between the second epitaxial pattern 240 and the second gate insulating layer 250. The eighth semiconductor oxide layer 240I may include an eighth semiconductor material. The eighth semiconductor material may include a semiconductor material having a bond energy greater than Ge—Ge bonds.

In an example embodiment, the eighth semiconductor material may be obtained by removing at least some of germanium (Ge) from the material of the second epitaxial pattern 240. For example, the eighth semiconductor material may be obtained by removing at least some of germanium (Ge) from the material of the surface of the second epitaxial pattern 240. Accordingly, the concentration of germanium (Ge) of the eighth semiconductor material may be less than the concentration of germanium (Ge) of the second epitaxial pattern 240.

In an example embodiment, the germanium (Ge) concentration of the fourth semiconductor oxide layer 140I may be greater than the concentration of germanium (Ge) of the first to third semiconductor oxide layers 100I, 110I and 120I may be greater than the concentration of germanium (Ge) of the fifth to seventh semiconductor oxide layers 200I, 210I and 220I. Thus, depending on the concentrations of germanium (Ge) of the substrate 100, the active patterns, and the epitaxial pattern, the semiconductor oxide layers may have different concentrations of germanium (Ge).

Figure 15:
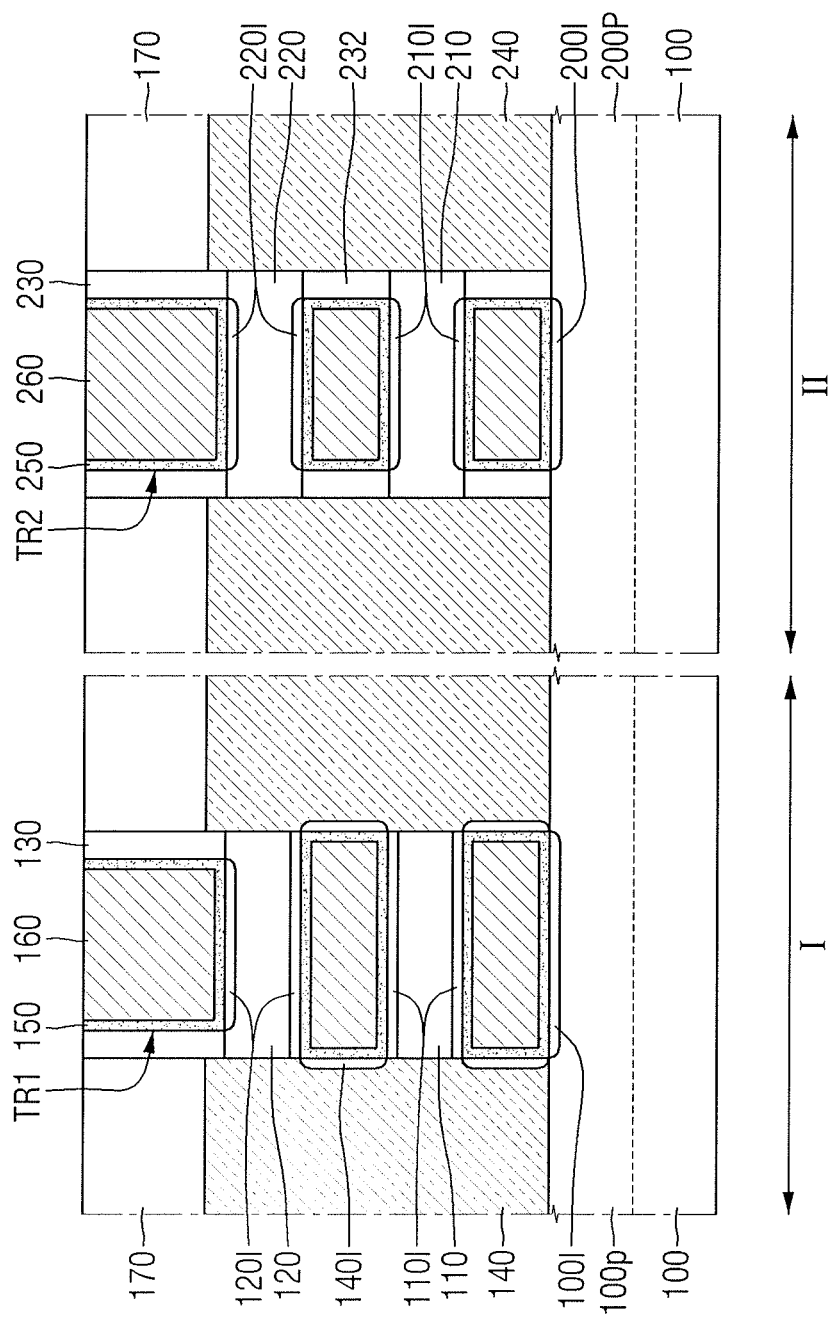
FIG. 15 illustrates a cross-sectional view of a semiconductor device according to an example embodiment.

FIG. 15 illustrates a cross-sectional view for illustrating a semiconductor device according to an example embodiment. Redundant descriptions on identical functions and elements described above with reference to FIGS. 1 to 10 and 14 may be omitted for convenience.

Referring to FIG. 15, according to an example embodiment, a semiconductor device formed in the second area II of the substrate 100 may further include third gate spacers 232.

The third gate spacers 232 may be formed on at least one side wall of the second gate electrode 260 surrounding the third active pattern 210 and the fourth active pattern 220. The third gate spacers 232 may be inner spacers. For example, the third gate spacers 232 may be formed between the second fin-shaped protrusion 200P and the third active pattern 210. In addition, the third gate spacers 232 may be formed between the third active pattern 210 and the fourth active pattern 220.

Although only the second gate spacers 230 are shown on the fourth active pattern 220, depending on the configuration of the stack for forming the third active pattern 210 and the fourth active pattern 220, the second gate spacers 230, and the third gate spacers 232 may be formed on the fourth active pattern 220.

Although the width of the second gate spacers 230 is equal to the width of the third gate spacers 232 in the drawing, the width may be varied.

In an example embodiment, a part of the semiconductor oxide layers may be buried in the respective active patterns between the third gate spacers 232. For example, the sixth semiconductor oxide layer 210I may be buried in the third active pattern 210 between the third gate spacers 232. In another implementation, for example, a part of the seventh semiconductor oxide layer 220I may be buried in the fourth active pattern 220 between the third gate spacers 232.

In a semiconductor device according to an example embodiment, the transistor in the first area I may be a PMOS transistor, while the transistor in the second area II may be a NMOS transistor. For example, the first epitaxial pattern 140 may include p-type impurities, and the second epitaxial pattern 240 may include n-type impurities.

Hereinafter, a method for fabricating a semiconductor device according to an example embodiment will be described with reference to FIGS. 1 to 36.

FIGS. 16 to 31 illustrate cross-sectional views of stages in a method for fabricating a semiconductor device according to an example embodiment. Redundant descriptions on identical functions and elements described above with reference to FIGS. 1 to 15 may be omitted for convenience.

Figure 16:
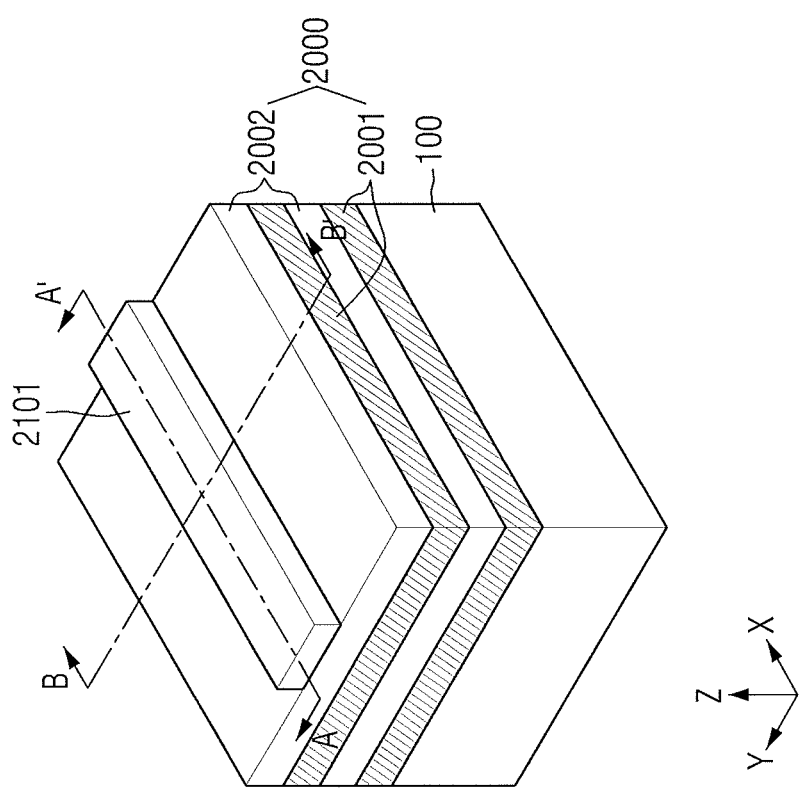
FIGS. 16 to 31 illustrate cross-sectional views of stages in a method of fabricating a semiconductor device according to an example embodiment.

It is to be noted that FIGS. 17, 19, 21, 23 to 25, 27 and 30 illustrate cross-sectional views taken along line A-A' of FIG. 16. In addition, FIGS. 18, 20, 22, 26, 28 and 31 illustrate cross-sectional views taken along the line B-B' of FIG. 16.

Figure 17:
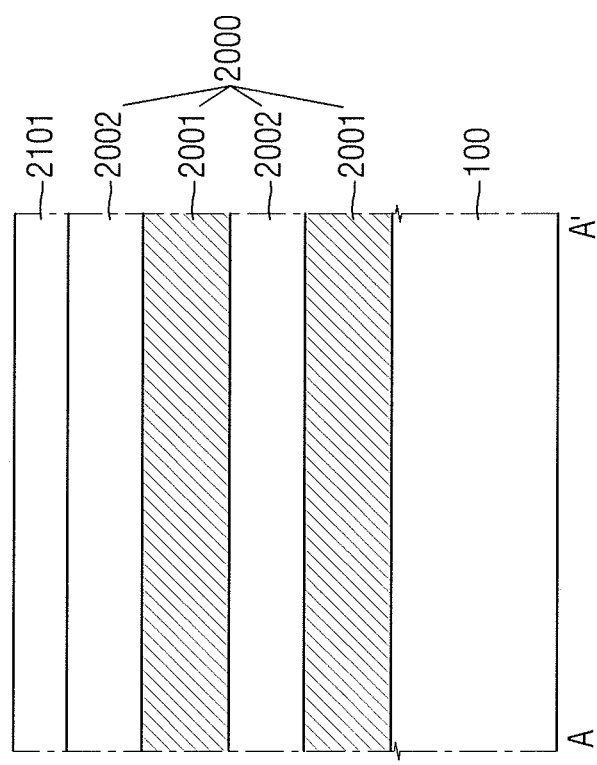
Figure 18:
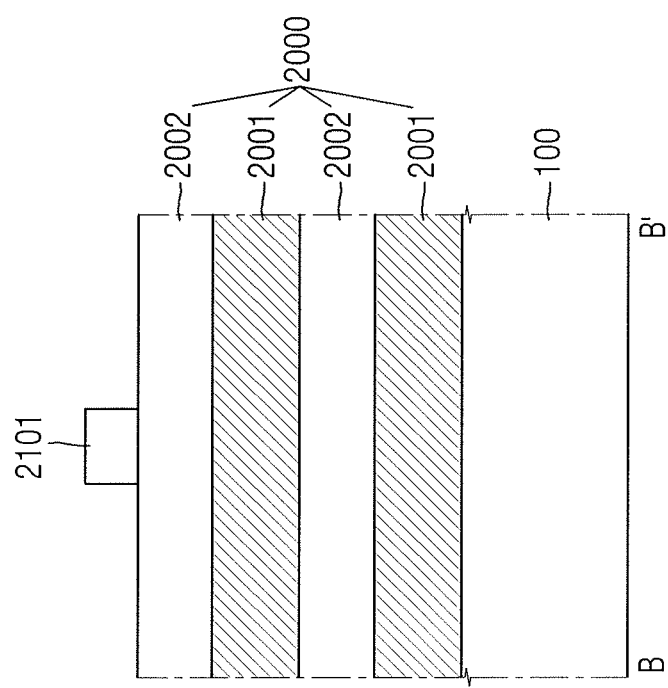

Referring to FIGS. 16 to 18, a stack of semiconductor layers 2000 is formed on the substrate 100, which includes sacrificial layers 2001 and active layers 2002 alternately stacked on one another.

The active layers 2002 may include a material having an etch selectivity to the sacrificial layers 2001. The sacrificial layers 2001 and the active layers 2002 may be formed by, for example, epitaxial growth.

Although the two sacrificial layers 2001 and the two active layers 2002 are shown for convenience, the number may be varied. Although one of the active layers 2002 is disposed at the top of the stack of semiconductor layer 2000, one of the sacrificial layers 2001 may be disposed at the top of the stack of semiconductor layers 2000.

In an example embodiment, the active layers 2002 may include germanium (Ge), which is an elemental semiconductor material. For example, the active layers 2002 may include silicon germanium (SiGe) or a high concentration of germanium (Ge).

Subsequently, the first mask pattern 2101 is formed on the stack of semiconductor layers 2000. The first mask pattern 2101 may extend in the first direction X.

Figure 19:
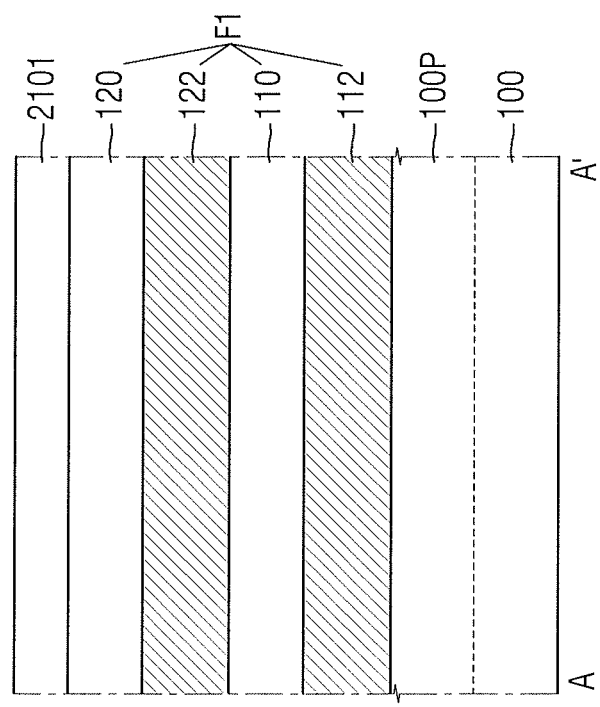
Figure 20:
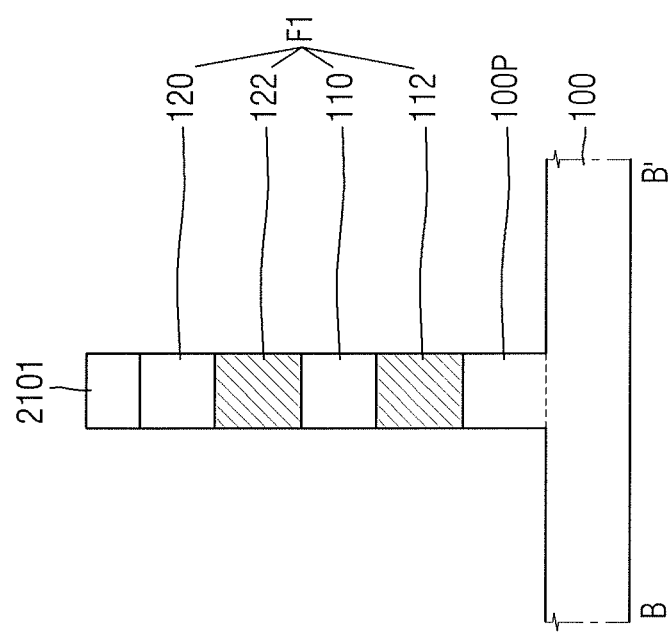

Referring to FIGS. 19 and 20, an etching process is carried out using the first mask pattern 2101 as an etching mask. Thus, the fin-shaped feature F1 may be formed on the substrate 100.

The sacrificial layer 2001 may be etched to form a first sacrificial pattern 112 and a second sacrificial pattern 122 that extend in the first direction X. The active layers 2002 may be etched to form a first active pattern 110 and a second active pattern 120 that extend in the first direction X.

Thus, the fin-shaped feature F1 may include the first fin-shaped protrusion 100P, and the first sacrificial pattern 112, the first active pattern 110, the second sacrificial pattern 122, and the second active pattern 120 sequentially stacked on the first fin-shaped protrusion 100P.

Figure 21:
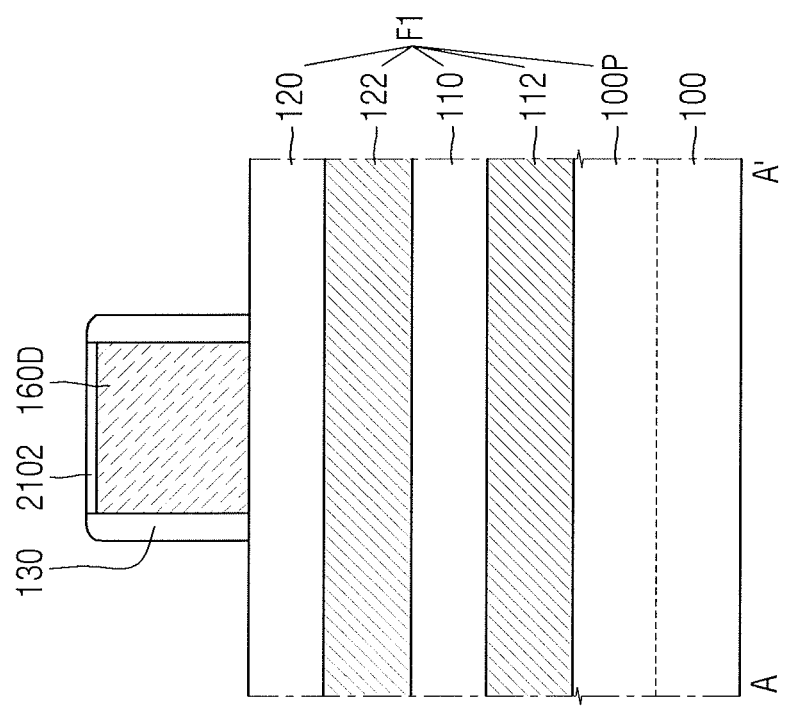
Figure 22:
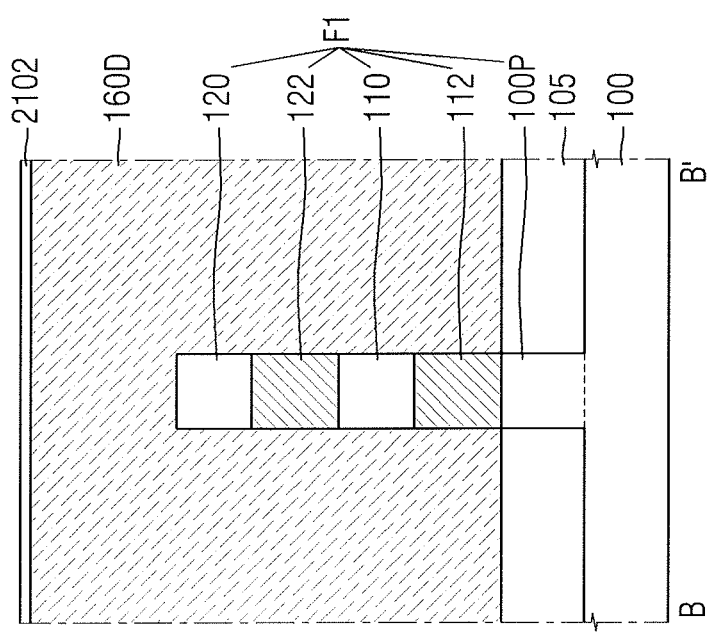

Referring to FIGS. 21 and 22, a field insulating layer 105 is formed on the substrate 100 which covers at least a part of the side walls of the fin-shaped feature F. During the process of forming the field insulating layer 105, the first mask pattern 2101 may be removed.

Subsequently, a dummy gate electrode 160D is formed over the fin-shaped feature F1, which intersects with the fin-shaped feature F1 and extends in the second direction Y. The dummy gate electrode 160D may be formed using the second mask pattern 2102 as an etching mask. In an implementation, a dummy gate insulating layer or a fin-shaped feature protecting layer may be further formed between the dummy gate electrode 160D and the fin-shaped feature F1.

Subsequently, on at least one side wall of the dummy gate electrode 160D, first gate spacers 130 may be formed.

Figure 23:
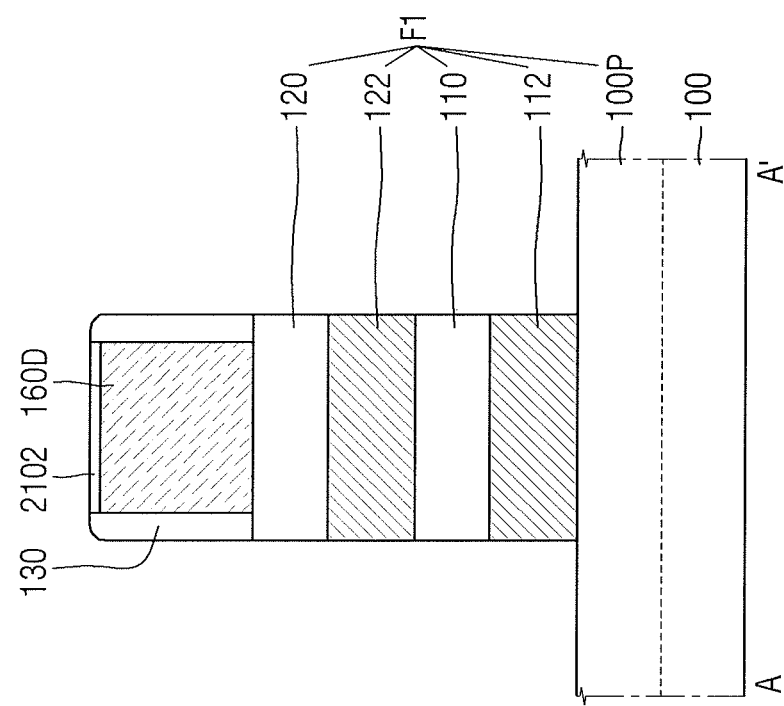

Referring to FIG. 23, an etching process is carried out using the dummy gate electrode 160D and the first gate spacers 130 as an etching mask.

Thus, a part of the fin-shaped feature F1 extending in the first direction X may be removed. For example, a part of the first sacrificial pattern 112, a part of the first active pattern 110, a part of the second sacrificial pattern 122, and a part of the second active pattern 120 may be removed. In an implementation, the fin-shaped feature F1 may include an undercut. For example, the fin-shaped feature F1 may include an undercut formed at the bottom of the dummy gate electrode 160D or the first gate spacers 130.

The etching process using the dummy gate electrode 160D and the first gate spacers 130 as an etch mask may be carried out until the top surface of the first fin-shaped protrusion 100P is exposed. In another implementation, a part of the first fin-shaped protrusion 100P may be removed by the etching process using the dummy gate electrode 160D and the first gate spacers 130 as an etching mask.

Figure 24:
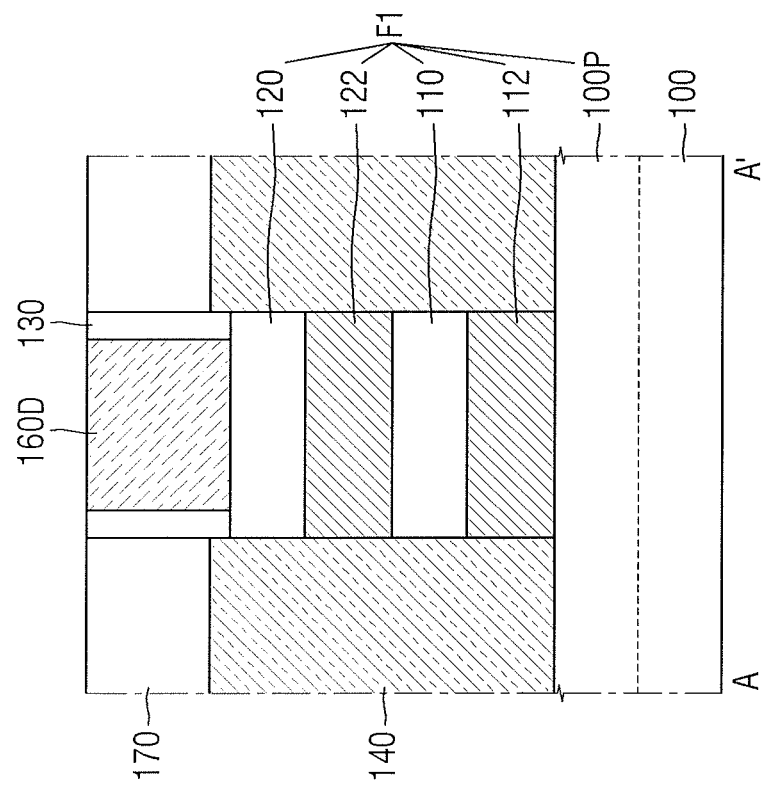

Referring to FIG. 24, a first epitaxial pattern 140 is formed on either side wall of the dummy gate electrode 160D.

For example, the first epitaxial pattern 140 may be formed by epitaxial growth from the first fin-shaped protrusion 100P, the first sacrificial pattern 112, the first active pattern 110, the second sacrificial pattern 122, and the second active pattern 120. Thus, the first epitaxial pattern 140 in contact with the first active pattern 110 and the second active pattern 120 may be formed.

In an example embodiment, the first epitaxial pattern 140 may be made up of multiple layers. For example, the first epitaxial pattern 140 may include the first epitaxial layer 142 and the second epitaxial layer 144 of FIG. 11.

Subsequently, an interlayer dielectric layer 170 covering the first epitaxial pattern 140 may be formed on the substrate 100. The dummy gate electrode 160D may be exposed by the interlayer dielectric layer 170.

For example, initially, the interlayer dielectric layer 170 covering the dummy gate electrode 160D and the first epitaxial pattern 140 may be formed. Subsequently, a planarization process may be carried out until the upper surface of the dummy gate electrode 160D is exposed.

While the interlayer dielectric layer 170 is formed, the second mask pattern 2102 may be removed.

Figure 25:
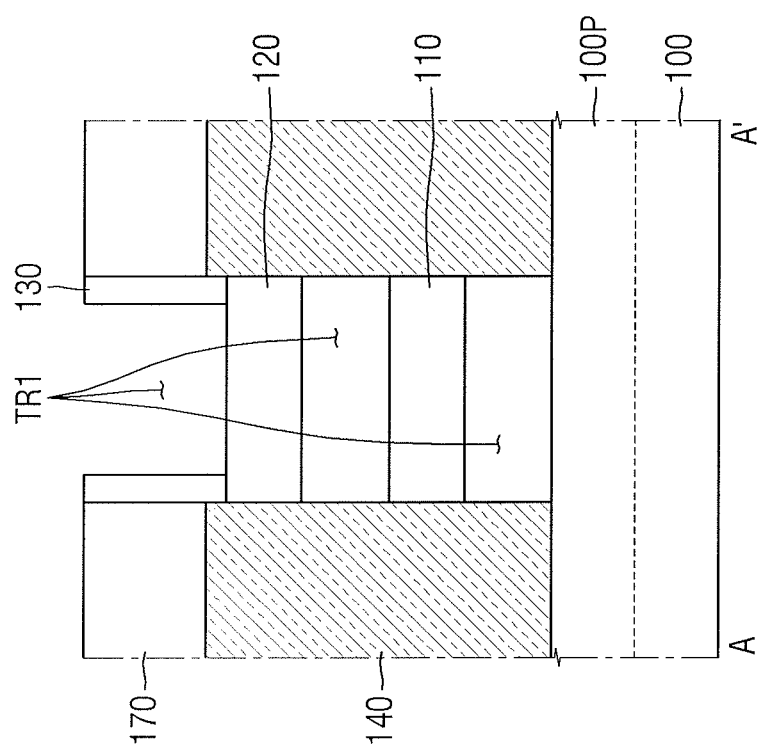
Figure 26:
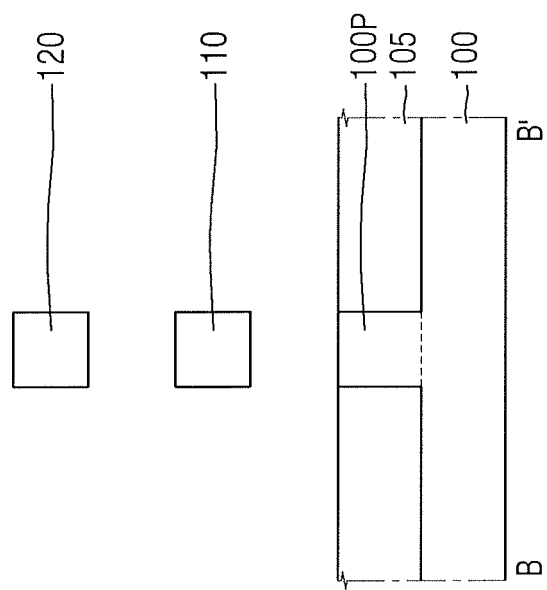

Referring to FIGS. 25 and 26, the dummy gate electrode 160D, the first sacrificial pattern 112 and the second sacrificial pattern 122 are selectively removed.

Accordingly, the first trench TR1 extending in the second direction Y may be formed. Thus, the first active pattern 110 may be formed spaced apart from the first fin-shaped protrusion 100P, and the second active pattern 120 may be formed spaced apart from the first active pattern 110. In addition, a part of the substrate 100, a part of the first active pattern 110, a part of the second active pattern 120, and a part of the first epitaxial pattern 140 may be exposed.

Figure 27:
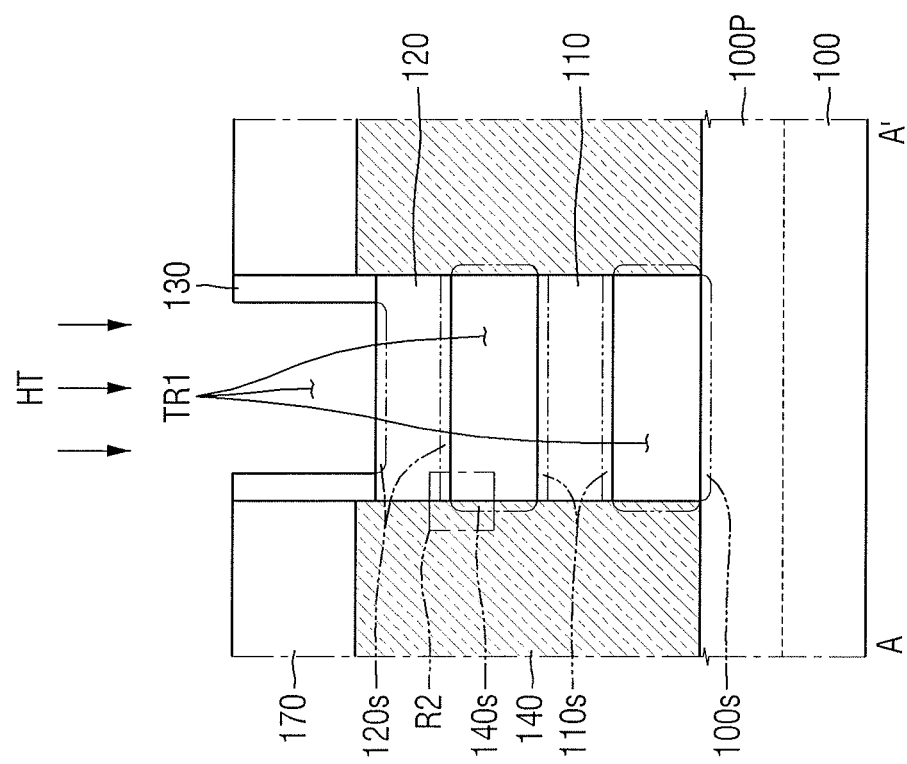
Figure 28:
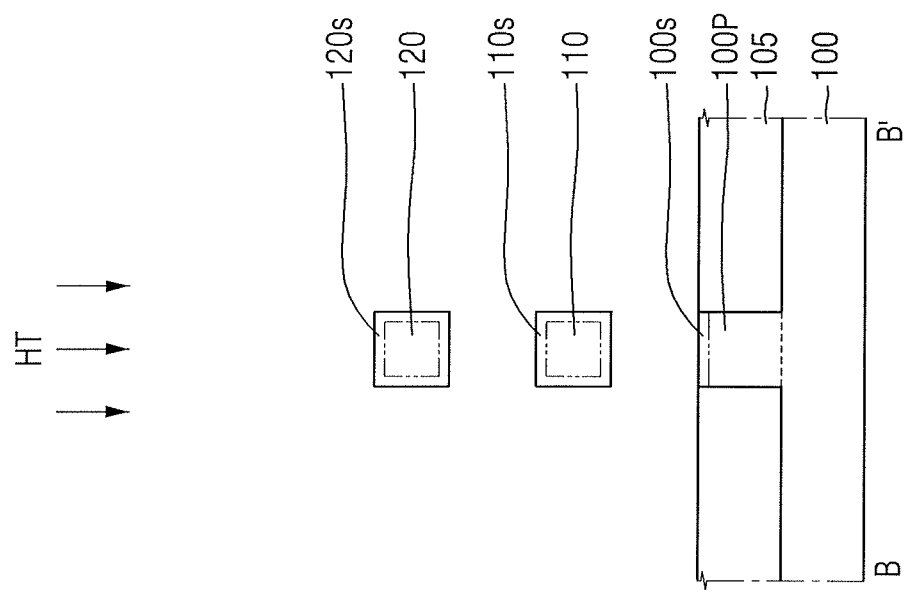

Referring to FIGS. 27 and 28, a hydro-treating process (HT) is carried out on the result obtained by the processes according to FIGS. 25 and 26.

The hydro-treating process (HT) removes at least some of the germanium (Ge) from the exposed surface of the substrate 100, the first active pattern 110, the second active pattern 120, and the first epitaxial pattern 140. Thus, on the exposed surface of the substrate 100, the first active pattern 110, the second active pattern 120 and the first epitaxial pattern 140, a first preliminary semiconductor oxide layer 100s with a reduced concentration of germanium (Ge), a second preliminary semiconductor oxide layer 110s, a third preliminary semiconductor oxide layer 120s, and a fourth preliminary semiconductor oxide layer 140s may be formed.

The hydro-treating process (HT) may involve, for example, a hydrogen plasma treating process and/or a hydrogen annealing process.

Figure 29:
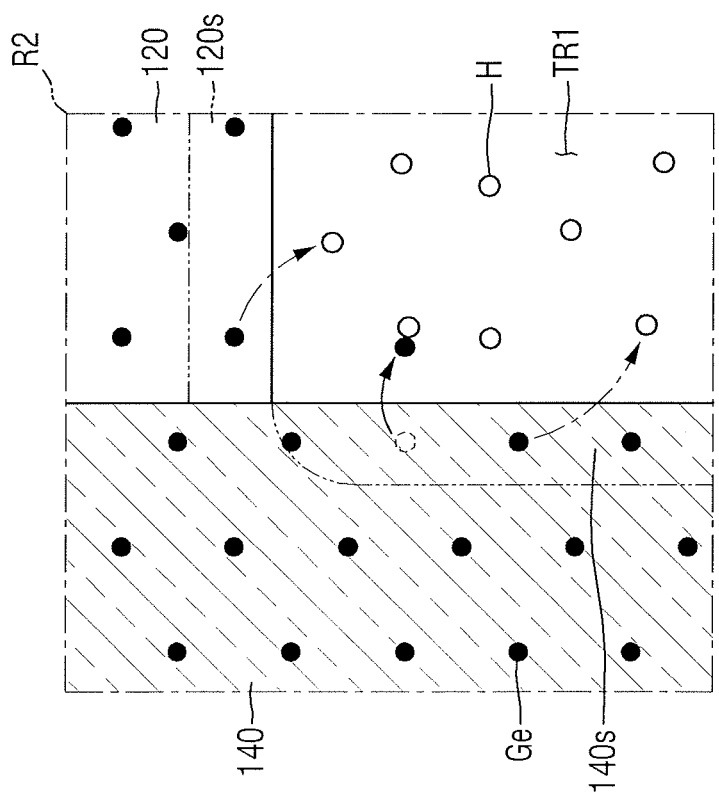

Hereinafter, removing germanium (Ge) using the hydro-treating process (HT) will be described with reference to FIG. 29. Although FIG. 29 is an enlarged view of the third semiconductor oxide layer 120I as an example of the semiconductor oxide layers formed on the active patterns, it is to be understood that the description can be equally applied to the other semiconductor oxide layers. For example, the first semiconductor oxide layer 100I or the second semiconductor oxide layers 110I may also be shown enlarged together with the fourth semiconductor oxide layer 140I. In addition, for convenience, the hydro-treating process (HT) is described as including a hydrogen plasma treatment process.

As shown in FIG. 29, hydrogen plasma H may be used to remove germanium (Ge) from the surface of the second active pattern 120 and the surface of the first epitaxial pattern 140 exposed via the first trench TR1.

If the second active pattern 120 and the first epitaxial pattern 140 include a semiconductor material having a bond energy higher than that of the Ge—Ge bonds, the hydrogen plasma H may be used to selectively remove the germanium (Ge).

For example, the second active pattern 120 and the first epitaxial pattern 140 may include silicon germanium (SiGe). Since the bond energy of silicon (Si) is higher than the bond energy of germanium (Ge), hydrogen plasma H may first react with the germanium (Ge) on the surface of the second active pattern 120 and the surface of the first epitaxial pattern 140. For example, volatile $GeH_4$ (germane) may be formed and removed.

Thus, at least some of the germanium (Ge) is selectively removed from the surface of the second active pattern 120, so that a third preliminary semiconductor oxide layer 120s having a low concentration of germanium (Ge) may be formed. Thus, the third preliminary semiconductor oxide layer 120s including a semiconductor material having a higher bond energy than that of Ge—Ge bonds may be formed. For example, the third preliminary semiconductor oxide layer 120s having a concentration of silicon (Si) higher than that of the second active pattern 120 may be formed.

In addition, at least some of the germanium (Ge) is selectively removed from the surface of the first epitaxial pattern 140, so that a fourth preliminary semiconductor oxide layer 140s having a low concentration of germanium (Ge) may be formed. Thus, the third preliminary semiconductor oxide layer 120s including a semiconductor material having a higher bond energy than that of germanium (Ge) may be formed. For example, the fourth preliminary semiconductor oxide layer 140s having a concentration of silicon (Si) higher than that of the first epitaxial pattern 140 may be formed.

When the concentration of germanium (Ge) of the first epitaxial pattern 140 is different from the concentration of germanium (Ge) of the second active pattern 120, the concentration of germanium (Ge) of the fourth preliminary semiconductor oxide layer 140s may be different from the concentration of germanium (Ge) of the third preliminary semiconductor oxide layer 120s. For example, the first epitaxial pattern 140 may include $Si_{0.3}Ge_{0.7}$, and the second active pattern 120 may include $Si_{0.5}Ge_{0.5}$. In this case, for example, the fourth preliminary semiconductor oxide layer 140s may include $Si_{0.7}Ge_{0.3}$, and the third preliminary semiconductor oxide layer 120s may include $Si_{0.9}Ge_{0.1}$.

Figure 30:
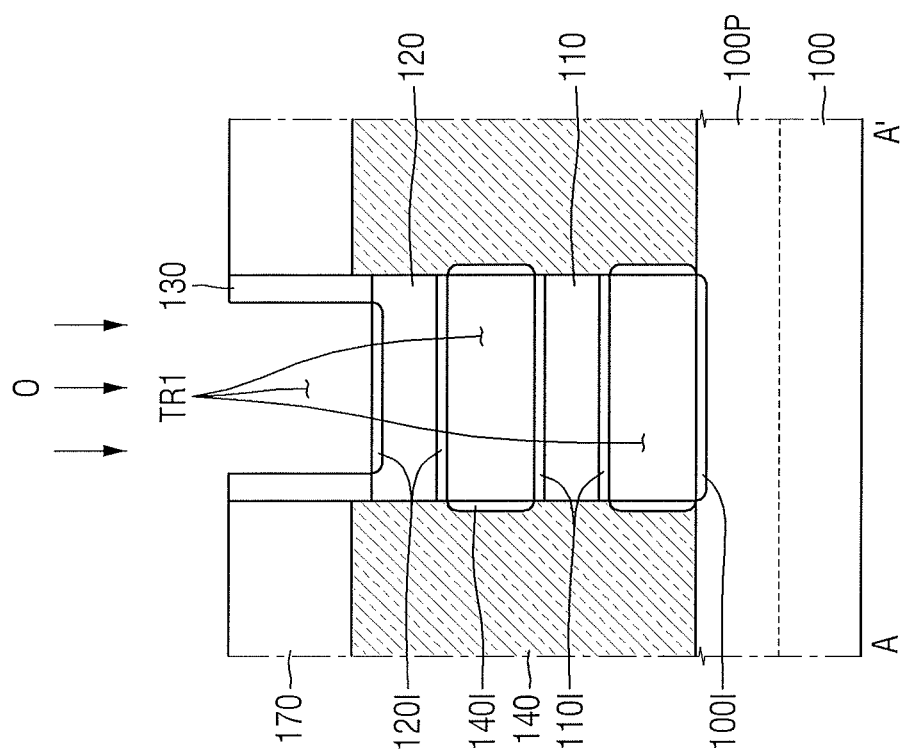
Figure 31:
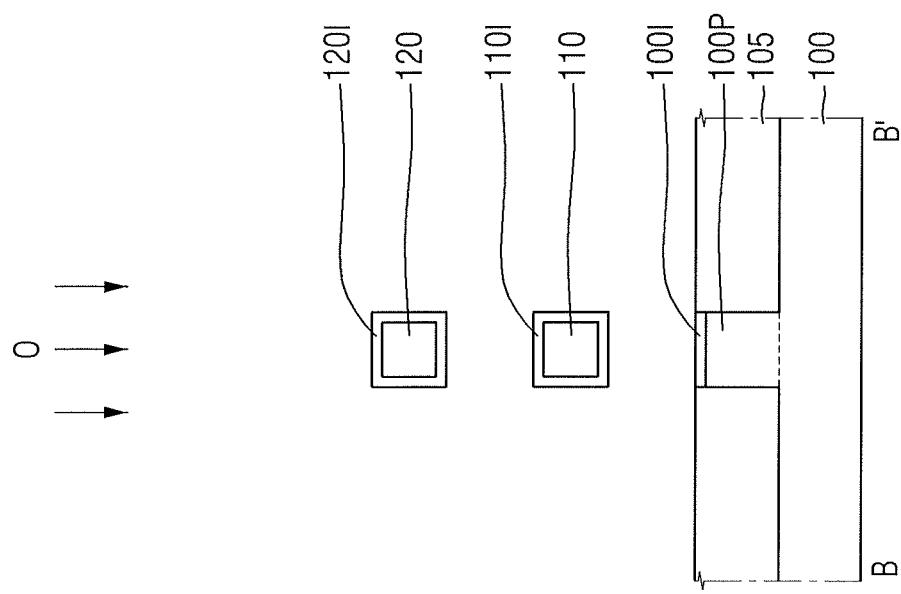

Referring to FIGS. 30 and 31, an oxidation process (O) is carried out on the result obtained by the processes of FIGS. 27 and 28.

The oxidation process (O) may involve, for example, a thermal oxidation process. The thermal oxidation process may include, for example, a dry oxidation process or a wet oxidation process.

By performing the oxidation process (O), the first preliminary semiconductor oxide layer 100s, the second preliminary semiconductor oxide layer 110s, the third preliminary semiconductor oxide layer 120s and the fourth preliminary semiconductor oxide layer 140s are oxidized, such that a first semiconductor oxide layer 100I, a second semiconductor oxide layer 110I, a third semiconductor oxide layer 120I and a fourth semiconductor oxide layer 140I may be formed, respectively.

Subsequently, referring to FIGS. 1 to 10, the first gate insulating layer 150 and the first gate electrode 160 are formed in the first trench TR1.

Although the first gate electrode 160 is shown as a single layer, the first gate electrode 160 may be made up of multiple layers. For example, the first gate electrode 160 may include a work function conductive layer for adjusting a work function, and a filling conductive layer used to fill a space formed by the work function conductive layer.

FIGS. 32 to 36 illustrate cross-sectional views for illustrating processing steps of a method for fabricating a semiconductor device according to an example embodiment. Redundant descriptions on identical functions and elements described above with reference to FIGS. 1 to 31 may be omitted for convenience.

Figure 32:
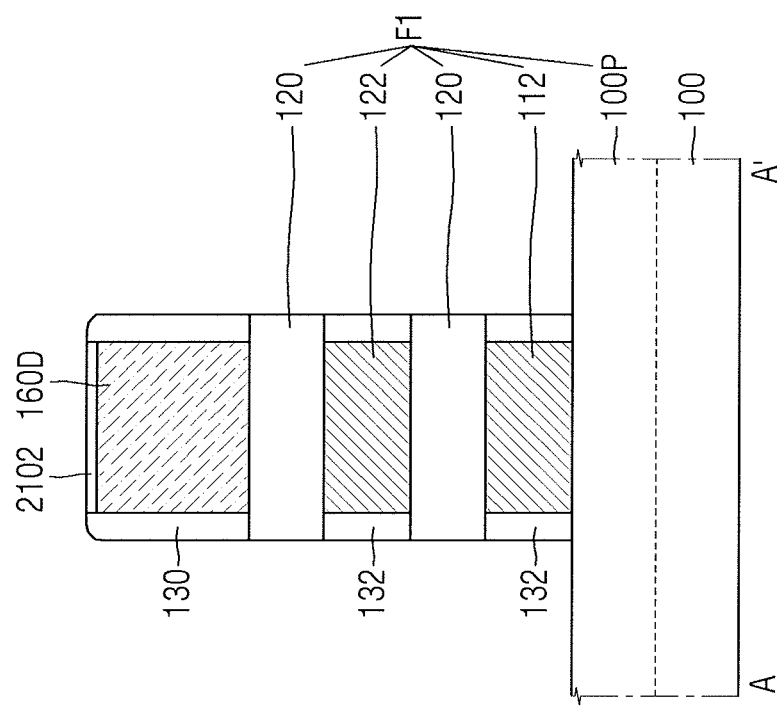
FIGS. 32 to 36 illustrate cross-sectional views of stages in a method of fabricating a semiconductor device according to an example embodiment.
Figure 34:
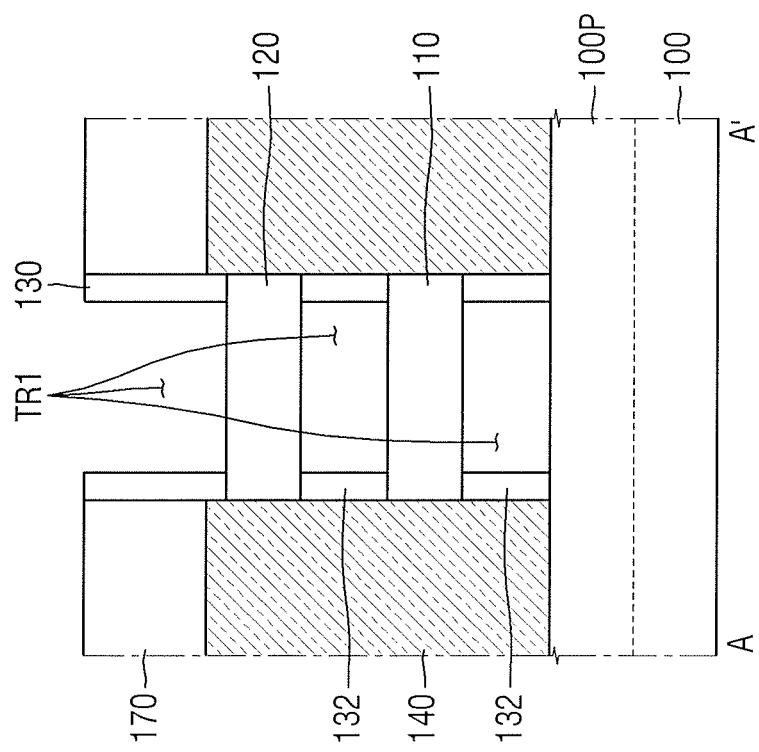
Figure 35:
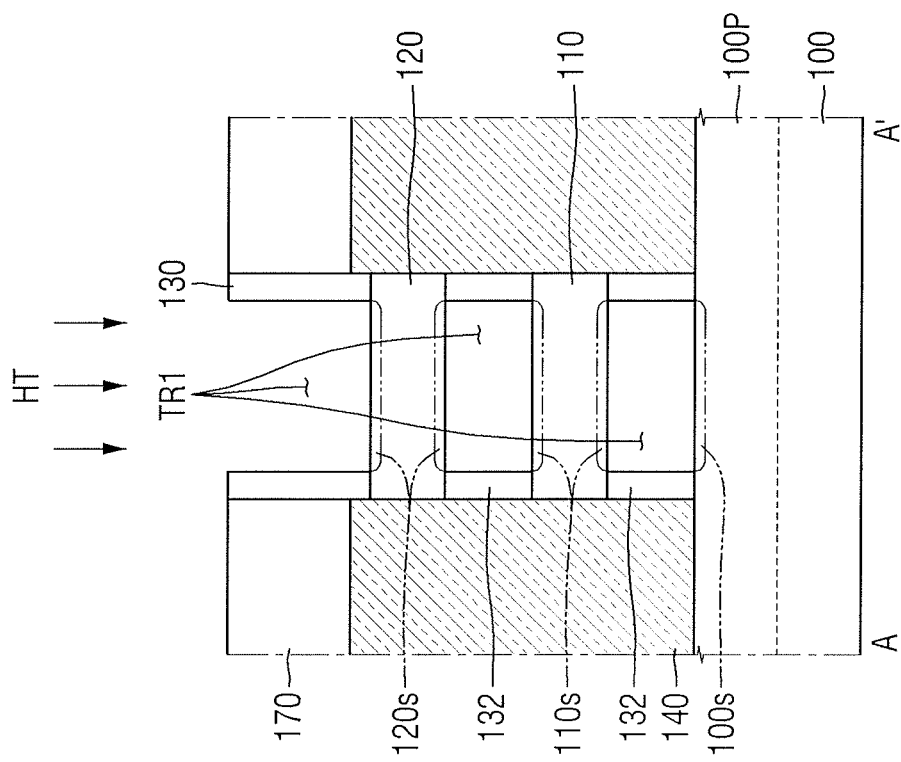
Figure 36:
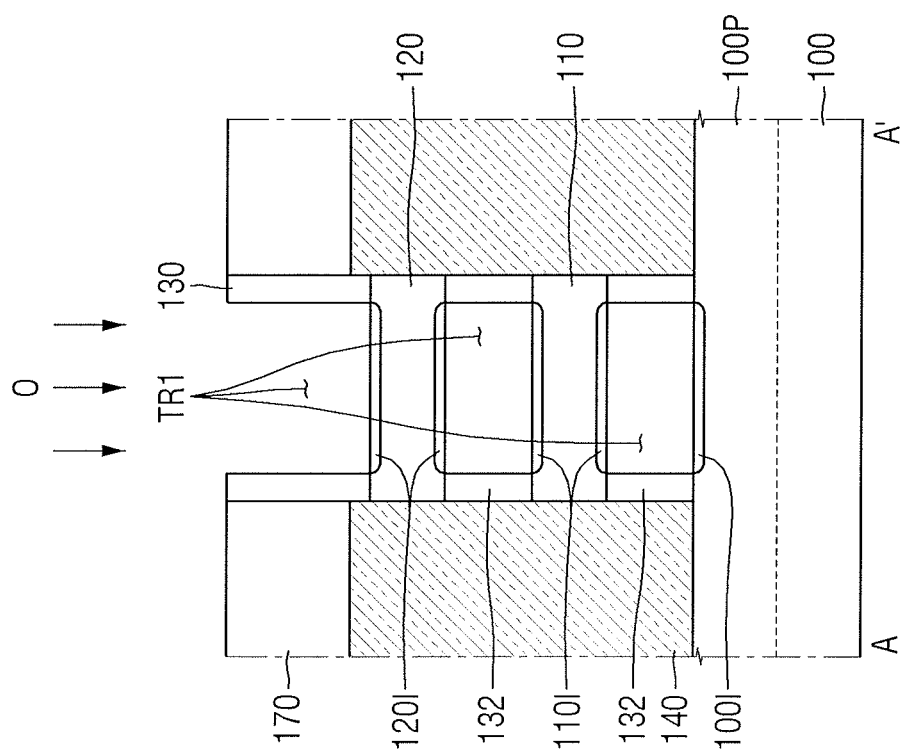

It is to be noted that FIGS. 32 to 36 are views for illustrating the processes after the processes of FIG. 32 to 36. FIGS. 32 and 36 illustrate cross-sectional views taken along line A-A' of FIG. 16.

Referring to FIG. 32, fourth gate spacers 132 are formed on the side walls of the dummy gate electrode 160D.

Initially, the side walls of the first sacrificial pattern 112 and the side walls of the second sacrificial pattern 122 may be selectively recessed. Subsequently, the fourth gate spacers 132 may be formed in the locations where the side walls of the first sacrificial pattern 112 and the side walls of the second sacrificial pattern 122 have been recessed.

Thus, the fourth gate spacers 132 may be formed between the first fin-shaped protrusion 100P and the first active pattern 110. In addition, the fourth gate spacers 132 may be formed between the first active pattern 110 and the second active pattern 120.

Figure 33:
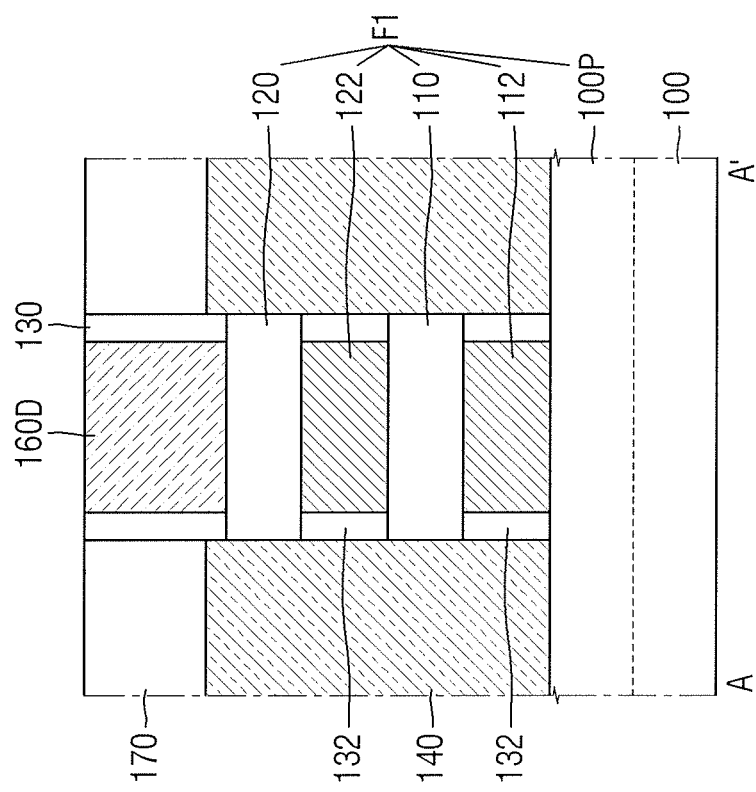

Referring to FIG. 33, first epitaxial patterns 140 are formed on both side walls of the dummy gate electrode 160D.

The forming the first epitaxial pattern 140 is similar to that described above with reference to FIG. 24, and a detailed description thereon may be omitted.

Referring to FIG. 34, the dummy gate electrode 160D, the first sacrificial pattern 112 and the second sacrificial pattern 122 are selectively removed.

The selectively removing the dummy gate electrode 160D, the first sacrificial pattern 112 and the second sacrificial pattern 122 is similar to that described above with reference to FIGS. 25 and 26; and a detailed description thereon may be omitted.

Referring to FIG. 35, hydro-treating process (HT) is carried out on the result obtained by the process of FIG. 34.

The performing the hydro-treating process (HT) is similar to that described above reference to FIGS. 27 to 29, and thus differences will be mainly described below.

The hydro-treating process (HT) removes at least some of the germanium (Ge) from the exposed surface of the substrate 100, the first active pattern 110, the second active pattern 120, and the first epitaxial pattern 140, and thus at least a part of the preliminary semiconductor oxide layer may be formed between the gate spacers.

For example, the first preliminary semiconductor oxide layer 100s may be formed in the substrate 100 between the fourth gate spacers 132. The second preliminary semiconductor oxide layer 110s may be formed in the first active pattern 110 between the fourth gate spacers 132. A part of the third preliminary semiconductor oxide layer 120s may be formed in the second active pattern 120 between the first gate spacers 130. The other part of the third preliminary semiconductor oxide layer 120s may be formed in the second active pattern 120 between the fourth gate spacers 132.

Referring to FIG. 36, an oxidation process (O) is carried out on the result obtained by the process of FIG. 35.

The performing the oxidation process (O) is similar to that described above with reference to FIGS. 30 and 31, and therefore a detailed description thereon may be omitted.

Subsequently, a first gate insulating layer 150 and a first gate electrode 160 are formed in the first trench TR1.

Thus, a semiconductor device including inner spacers may be fabricated. For example, the semiconductor device such as one formed in the second area II of FIG. 15 may be fabricated.

By way of summation and review, it may be relatively easy to scale multi-gate transistors since they utilize three-dimensional channels. In addition, may be possible to improve current control ability even without increasing the gate length of such multi-gate transistors. Further, the short-channel effect (SCE), which refers to the influence on the potential at a channel region by a drain voltage, may be effectively suppressed.

As described above, embodiments relate to a semiconductor device having a channel including germanium (Ge), and a method for fabricating the same. Embodiments may provide a semiconductor device, and associated method, providing improved performance and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a gate electrode extending in a first direction on a substrate;
    a first active pattern extending in a second direction intersecting the first direction on the substrate to penetrate the gate electrode, the first active pattern including germanium;
    an epitaxial pattern on a side wall of the gate electrode;
    a first semiconductor oxide layer between the first active pattern and the gate electrode, and including a first semiconductor material; and
    a second semiconductor oxide layer between the gate electrode and the epitaxial pattern, and including a second semiconductor material,
    wherein a concentration of germanium of the first semiconductor material is less than a concentration of germanium of the first active pattern, and
    wherein the concentration of germanium of the first semiconductor material is different from a concentration of germanium of the second semiconductor material.

2. The semiconductor device as claimed in claim 1, wherein the concentration of germanium of the second semiconductor material is less than a concentration of germanium of the epitaxial pattern.

3. The semiconductor device as claimed in claim 2, wherein the epitaxial pattern includes silicon germanium.

4. The semiconductor device as claimed in claim 1, wherein the concentration of germanium of the first semiconductor material is less than the concentration of germanium of the second semiconductor material.

5. The semiconductor device as claimed in claim 1, wherein a concentration of silicon of the first semiconductor material is greater than a concentration of silicon of the first active pattern.

6. The semiconductor device as claimed in claim 1, wherein a concentration of silicon of the second semiconductor material is greater than a concentration of silicon of the epitaxial pattern.

7. The semiconductor device as claimed in claim 1, wherein the first semiconductor oxide layer extends along a profile of an outer surface of the first active pattern.

8. The semiconductor device as claimed in claim 1, further comprising:
   a second active pattern extending in the second direction above the first active pattern and penetrating the gate electrode, the second active pattern including germanium; and
   a second semiconductor oxide layer between the second active pattern and the gate electrode, the second semiconductor oxide layer including a third semiconductor material,
   wherein a concentration of germanium of the third semiconductor material is less than the concentration of germanium of the second active pattern, and
   wherein the concentration of germanium of the third semiconductor material is different from the concentration of germanium of the second semiconductor material.

9. The semiconductor device as claimed in claim 1, further comprising:
   a fin-shaped protrusion protruding from an upper surface of the substrate and extending in the second direction; and
   a third semiconductor oxide layer between the fin-shaped protrusion and the gate electrode and including a third semiconductor material,
   wherein a concentration of germanium of the third semiconductor material is less than a concentration of germanium of the fin-shaped protrusion.

10. The semiconductor device as claimed in claim 9, further comprising:
    a field insulating layer surrounding at least a part of side walls of the fin-shaped protrusion,
    wherein the third semiconductor oxide layer extends along a profile of an outer surface of the fin-shaped protrusion exposed by the field insulating layer.

11. A semiconductor device comprising:
    a first active pattern disposed above and spaced apart from a substrate, the first active pattern including germanium;
    a first gate electrode between the substrate and the first active pattern;
    a first epitaxial pattern disposed on side walls of the first active pattern and side walls of the first gate electrode;
    a first semiconductor oxide layer between the first active pattern and the first gate electrode, and including a first semiconductor material; and
    a second semiconductor oxide layer between the first gate electrode and the first epitaxial pattern, and including a second semiconductor material,
    wherein a concentration of germanium of the first semiconductor material is less than a concentration of germanium of the first active pattern, and
    wherein the concentration of germanium of the first semiconductor material is different from a concentration of germanium of the second semiconductor material.

12. The semiconductor device as claimed in claim 11, further comprising:
    gate spacers on the substrate that define two side walls of the first gate electrode,
    wherein at least a portion of the first semiconductor oxide layer is buried in the first active pattern between the gate spacers.

13. The semiconductor device as claimed in claim 11, further comprising:
    a gate insulating layer extending along an outer surface of the first gate electrode and in contact with the first semiconductor oxide layer and the second semiconductor oxide layer.

14. The semiconductor device as claimed in claim 11, further comprising:
    a third semiconductor oxide layer between the substrate and the first gate electrode, and including a third semiconductor material,
    wherein a concentration of germanium of the third semiconductor material is less than a concentration of germanium of the substrate.

15. The semiconductor device as claimed in claim 14, wherein at least a part of the third semiconductor oxide layer is buried in the substrate.

16. The semiconductor device as claimed in claim 11, wherein at least a part of the second semiconductor oxide layer is buried in the first epitaxial pattern.

17. The semiconductor device as claimed in claim 11, further comprising:
    a second active pattern disposed above and spaced apart from the substrate, and including a third semiconductor material;
    a second gate electrode between the substrate and the second active pattern; and
    a third semiconductor oxide layer between the second active pattern and the second gate electrode, and including a third semiconductor material,
    wherein a concentration of germanium of the third semiconductor material is greater than a concentration of germanium of the second active pattern.

18. A semiconductor device comprising:
    a gate electrode extending in a first direction on a substrate;
    an active pattern extending in a second direction intersecting the first direction on the substrate to penetrate the gate electrode, the active pattern including silicon germanium;
    an epitaxial pattern on a side wall of the gate electrode, the epitaxial pattern including silicon germanium, a concentration of germanium in the epitaxial pattern being different from a concentration of germanium in the active pattern;
    a first semiconductor oxide layer between the active pattern and the gate electrode and including an oxide of silicon and germanium; and
    a second semiconductor oxide layer between the gate electrode and the epitaxial pattern and including an oxide of silicon and germanium, a concentration of germanium in the second semiconductor oxide layer being different from a concentration of germanium in the first semiconductor oxide layer.

19. The semiconductor device as claimed in claim 18, wherein the active pattern is treated to remove germanium from a surface thereof such that a concentration of germanium of the active pattern increases away from a surface that contacts the first semiconductor oxide layer.

20. The semiconductor device as claimed in claim 18, wherein the active pattern comprises a first semiconductor layer, and a second semiconductor layer between the first semiconductor layer and the first semiconductor oxide layer,
   wherein the first semiconductor layer includes germanium, and
   wherein the second semiconductor layer includes silicon germanium.

* * * * *